(12) United States Patent
Wada et al.

(10) Patent No.: US 6,307,267 B1
(45) Date of Patent: Oct. 23, 2001

(54) SEMICONDUCTOR DEVICE AND MANUFACTURING METHOD THEREOF

(75) Inventors: Junichi Wada, Yokohama; Yasushi Oikawa, Tokyo; Tomio Katata, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/217,914

(22) Filed: Dec. 22, 1998

(30) Foreign Application Priority Data

Dec. 26, 1997 (JP) .................................................. 9-366809
Sep. 14, 1998 (JP) ................................................ 10-260036

(51) Int. Cl.⁷ .......................... H01L 23/48; H01L 23/52; H01L 29/40
(52) U.S. Cl. ........................ 257/761; 257/751; 257/758; 257/765; 257/771
(58) Field of Search ..................................... 257/751, 753, 257/765, 771, 767, 758, 761; 438/627, 643, 653, 927, 688

(56) References Cited

U.S. PATENT DOCUMENTS

| | | | |
|---|---|---|---|
| 4,829,363 | * 5/1989 | Thomas et al. | 257/751 |
| 5,225,372 | * 7/1993 | Savkar et al. | 438/653 |
| 5,592,024 | * 1/1997 | Aoyama et al. | 257/751 |
| 5,739,579 | * 4/1998 | Chiang et al. | 257/635 |
| 5,763,953 | * 6/1998 | Iijima et al. | 257/762 |
| 6,001,461 | * 12/1999 | Toyada et al. | 428/210 |

FOREIGN PATENT DOCUMENTS

| | | | |
|---|---|---|---|
| 59-2352 | 1/1984 | (JP) . | |
| 1-99255 | 4/1989 | (JP) . | |
| 03-220751 | 9/1991 | (JP) . | |
| 09-186238 | 7/1997 | (JP) . | |
| 09186238 | * 7/1997 | (JP) | H01L/21/768 |
| 10-74764 | 3/1998 | (JP) . | |

* cited by examiner

Primary Examiner—Tom Thomas
Assistant Examiner—Shouxiang Hu
(74) Attorney, Agent, or Firm—Finnegan, Henderson, Farabow, Garrett & Dunner, L.L.P.

(57) ABSTRACT

A semiconductor device is constituted by embedding an Al wiring layer in a second object formed on an interlayer-insulating film on one principal plane of a semiconductor substrate and connecting with an Al wiring formed on the substrate and at least, an Nb liner film and NbAl alloy film are formed between the second object and the Al wiring layer.

6 Claims, 14 Drawing Sheets

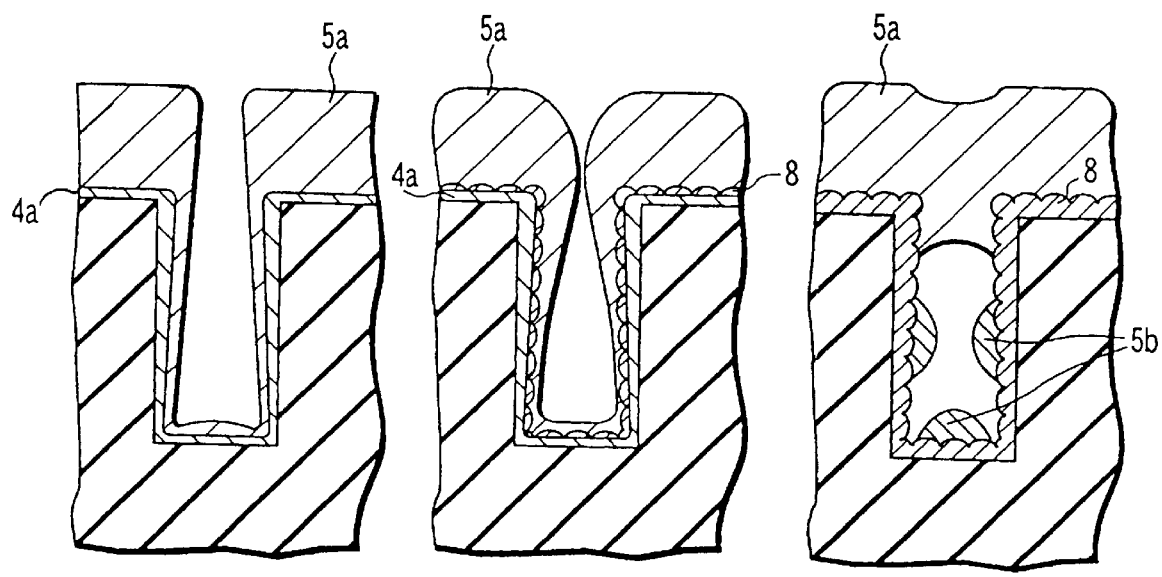
F I G. 5A  F I G. 5B  F I G. 5C

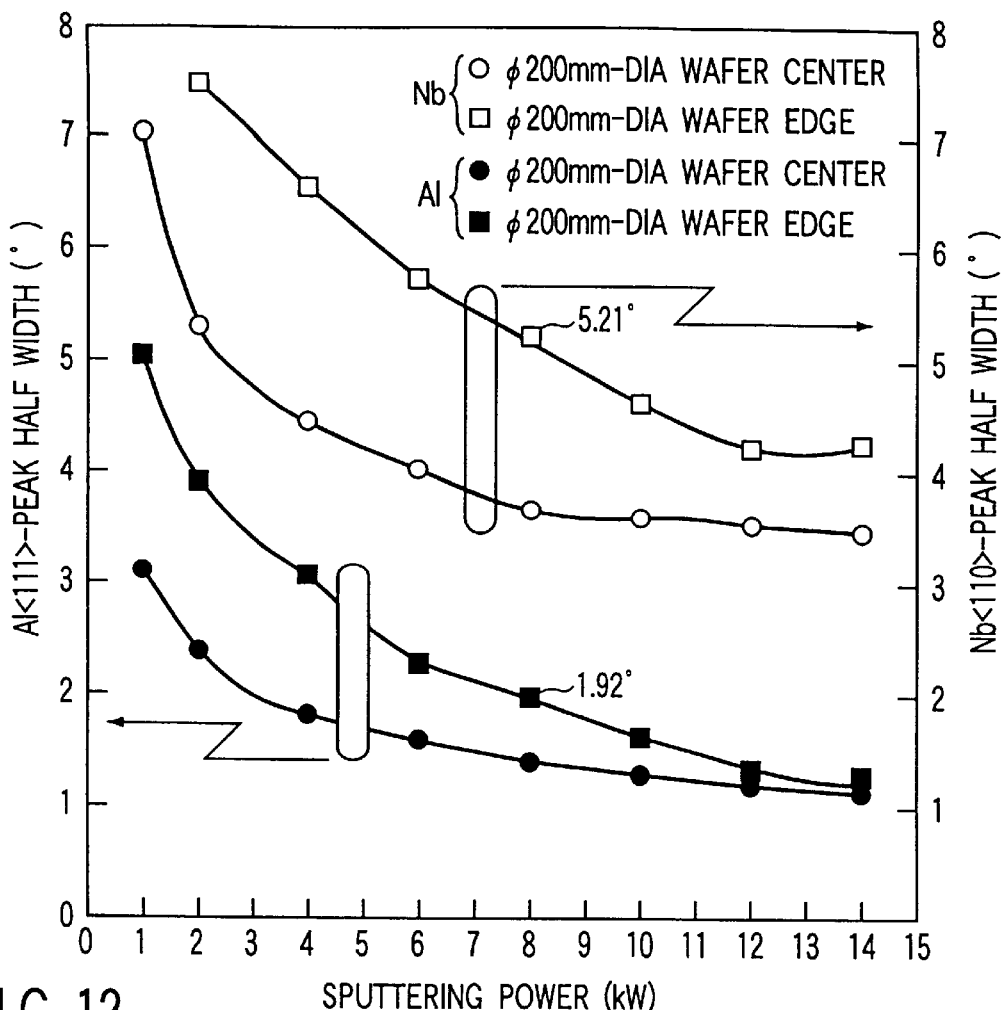
F I G. 12
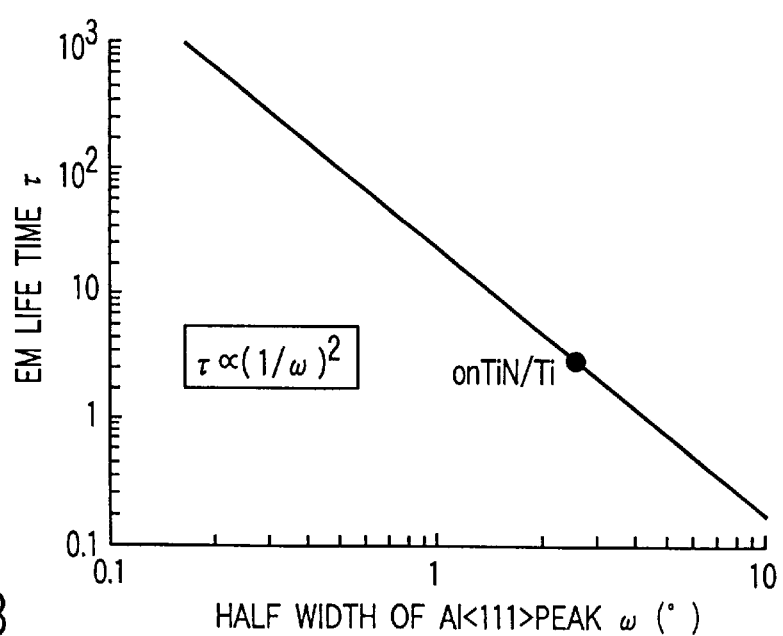
F I G. 13

SEMICONDUCTOR DEVICE AND MANUFACTURING METHOD THEREOF

BACKGROUND OF THE INVENTION

The present invention relates to a semiconductor device having a wiring structure in which an Al wiring layer is embedded in a interlayer-insulating film and manufacturing method thereof.

An Al wiring has been frequently used for a semiconductor device and an Al wiring made of an Al alloy mainly containing Al (hereafter, Al and Al alloy are generally referred to as Al) has been mainly used recently.

Particularly, an Al wiring (Al-RIE wiring) having a laminated structure is frequently used which is obtained by forming an Al film on a barrier metal film such as a TiN film for controlling the reaction with a lower-layer material or forming an antireflection film or an Al film for controlling the irregular reflection of light in a photolithography process and etching these laminated films through RIE.

However, this type of the Al-RIE wiring has a problem that an effective Al sectional area in a wiring sectional area is decreased due to the presence of the barrier metal film and antireflection film and thereby, the wiring resistance increases. Moreover, the Al-RIE wiring has a problem that the Al sectional area further decreases because RIE reaction products are deposited on the sidewall of the wiring under the RIE process of an Al film.

Furthermore, as the integration degree of an LSI is improved, it is necessary to form an Al wiring into a multilayer and the art for forming a plug for connecting upper and lower Al wirings becomes indispensable. There is a W(tungsten)-CVD art as one of the conventional plug forming arts, which shows a high step-coverage property.

FIG. 1 is a sectional view of a conventional multilayer Al wiring formed by the W-CVD art. In FIG. 1, a two-layer Al wiring is shown in which a first Al wiring 81 is connected to a second Al wiring 83 through a W plug 82. The first and second Al wirings 81 and 83 are formed respectively on a TiN/Ti barrier metal film 84 and moreover, upper sides of the first and second Al wirings 81 and 83 are respectively covered with a TiN antireflection fill m 85. Moreover, in FIG. 1, symbols 86 and 87 denote a fist interlayer-insulating film and a second interlayer-insulating film.

The W-CVD art includes two types such as "blanket deposition" and "selective deposition". The "blanket deposition" is a method of depositing a W film on the entire surface of a substrate including connection holes. The "selective deposition" is a method of selectively depositing a W film only on the bottom of a connection hole.

The both types can be realized in accordance with different heating conditions. However, though it is possible to fill the inside of a connection hole with a W film in one process in the case of the "selective deposition", etching-back process and CMP process for removing a W film from the outside of a connection hole are necessary as post-processes in the case of the "blanket deposition".

The W plug formed by the above-described W-CVD art has problems that it has a high resistance and lacks in the EM (electromigration) resistance.

The EM is a phenomenon in which Al atoms are moved due to collision of electrons when a current flows through an Al wiring. W is a material not easily causing the EM compared to Al. Therefore, by connecting upper and lower Al wirings each other by a W plug, the W plug serves as an EM diffusion barrier, Al accumulation occurs at the upstream side of an Al atom flow, and Al depletion occurs at the downstream side of the Al atom flow. This type of the Al accumulation or Al depletion causes hillock or void and resultantly causes a short circuit between wirings or disconnection of a wiring.

The above problem of the EM resistance is also present in an Al-RIE wiring. That is, this type of the Al wiring has problems that the Al<111> orientation degree is low, and the EM resistance cannot be secured because a barrier metal film such as a TiN film in which Al is not easily oriented is present as the substrate.

Moreover, the "entire-surface deposition" has a problem that the number of processes increases in addition to the above problem because a W film must be removed from the outside of a connection hole.

In the case of the "selective deposition", it is originally unnecessary to remove a W film from the outside of a connection hole. Actually, however, selectivity is frequently deteriorated and a W film is frequently formed on the outside of a connection hole. That is, the "selective deposition" also actually has a problem that it is necessary to remove a W film from the outside of a connection hole through etching-back later and thereby, the number of processes increases.

As other plug forming art, there is an Al reflow art for forming a plug by Al having a resistance lower than that of W. This art uses the flow characteristic based on the surface diffusion of an Al film, which makes it possible to fill the inside of a connection hole with an Al film by an easy method of heating a substrate and shorten a process by using the upper side of the Al film as a wiring. The Al reflow art has been variously studied so far, which frequently uses such substrate films as an Al film and a Ti (titanium) film having a high wettability.

Moreover, as the Al reflow art capable of lowering a flow temperature and expecting filling of a connection hole having a high A.R. (aspect ratio=connection-hole depth/connection-hole diameter), a two-step Al reflow art of sputter-forming an Al film without heating it and thereafter sputter-forming the Al film while heating it is known and is becoming a main stream.

Furthermore, many other Al reflow arts are proposed which are combined with a sputtering art having a high directivity such as the low-long throw sputtering method, collimation sputtering method, or HDP (High Density Plasma) sputtering method.

Because the Al reflow art forms an Al film by the sputtering method, the step coverage of the Al film is originally low. Therefore, the Al film at the bottom of a connection hole has a thin thickness. As a result, Al is agglomerated in a heating mode for fluidization and voids are produced inside of a connection hole. Therefore, the Al reflow art cannot fill a connection hole having a high aspect ratio.

To solve the above problem, agglomeration of Al is controlled by using a substrate film, such as a Ti film, having a high wettability with an Al film. However, when sputter-forming a Ti film, overhang of the Ti film occurs at the aperture of a connection hole and moreover, irregularity occurs on the surface of the Ti film. The irregularity is caused by the crystal plane dependency of Ti on crystal growth.

The above overhang and surface irregularity prevent an adhesion of Al and deteriorate the reflow characteristic. Moreover, even if using the directional sputtering method as a method for forming a Ti film, it is actually impossible to form a Ti film having a sufficient thickness on a connection hole.

Moreover, because Ti reacts on Al, an $Al_3Ti$ film having a high resistance is formed on the bottom of a connection hole. Because the $Al_3Ti$ film serves as an EM diffusion barrier the same as a W plug does, a problem occurs that the EM resistance is deteriorated.

Furthermore, it is recently studied to apply the Al reflow art to a wiring (DD wiring) having a damascene structure or a dual damascene structure. FIG. 2 shows a sectional view of a wiring having a conventional dual damascene structure formed by using the Al reflow art.

In FIG. 2, a first Al wiring 81 is embedded in a wiring groove 92 formed on the surface of a first layer-insulting film 86 and connected with a connection hole 88 formed on a second interlayer-insulating film 87 and a second Al wiring (hereafter referred to as DD wiring) 83 embedded in a wiring groove 89. In FIG. 2, symbol 90 denotes an $Al_3Ti$-alloy film and 91 denotes a third interlayer-insulating film.

The DD wiring 83 is obtained by previously forming the connection holes 88 the wiring groove and 89 in the second interlayer-insulating film 87, filling the insides of the connection holes 88 the wiring groove and 89 with an Al plug and an Al film serving as an Al wiring through one-time process at the same time, removing the outside extra Al film through CMP, and simultaneously forming the Al plug and the Al wiring. Therefore, it is possible to shorten the process and reduce the cost.

However, when using a Ti liner film as the substrate film of an Al film to form the DD wiring 83 by the Al reflow art, the following problems occur.

In the case of the above method, a connection hole and a wring groove are formed and thereafter, a Ti liner film (not shown) is formed on the entire surface to cover the entire inner surface (side and bottom) of the wiring groove with the Ti liner film.

Therefore, in the subsequent Al reflow process, an $Al_3Ti$ film 90 is formed on the inner surface of the wiring groove and the effective Al volume of the DD wiring 83 decreases. Because the $Al_3Ti$ film 90 has a high resistance, the resistance of the DD wiring 83 is increased. The increase of the wiring resistance becomes more serious problem as a wiring width is decreased.

Moreover, the $Al_3Ti$ film 90 is formed on the bottom of the connection hole 88 to serve as an EM diffusion barrier. Therefore, a problem occurs that the EM resistance deteriorates similarly to the case of the W-CVD art.

As described above, various plug-forming arts have been proposed in which the Al reflow art is studied to form a DD wiring. However, because an Al film is agglomerated at the bottom of a connection hole, a problem occurs that it is impossible to fill a connection hole having a high aspect ratio.

To solve the above problem, it is proposed to use an Al film and a Ti liner film having a high wettability as an underlayer. However, a problem occurs that an $Al_3Ti$ film is formed on the inner surface of a wiring groove and thereby, the wiring resistance increases and the EM resistance decreases.

As another prior art, when noticing only a local structure, a method is known that forms a metallic line in a patterned insulator layer in accordance with the CMP (Chemical Mechanical Polishing) planarization process by covering a patterned insulator layer for a via or the patterned insulator layer such as a wiring pattern with a Nb liner to form a Nb layer and attaching aluminum or an aluminum alloy onto the Nb layer. (Jap. Pat. Appln. KOKAI Publication No. 10-74764) According to this document, as a preferred embodiment, $Nb_2O_5$ is formed by CMP the aluminum or aluminum alloy formed on a Nb layer, exposing a Nb liner with oxidized acidic colloidal alumina slurry, and oxidizing the Nb liner. As a result, the Nb layer serves as a polish-stopping layer. Therefore, this document does not have an intention for positively forming an AlNb alloy is prevented between the Nb liner and the aluminum or aluminum alloy. Also, there is an oxide film in an interface between Al and Nb. The AlNb alloy is prevented from being easily produced.

BRIEF SUMMARY OF THE INVENTION

The present invention is made to solve the above problems and its object is to provide a semiconductor device and a manufacturing method thereof using a wiring structure for embedding an Al wiring layer in a connection hole formed on a interlayer-insulating film on one principal plane of a semiconductor substrate, capable of preventing the wiring resistance in the connection hole from increasing and the EM resistance from lowering, preventing agglomeration and stage disconnection of Al, and improving the adhesiveness between the Al wiring layer and the connection hole by setting at least an Nb liner film and an NbAl alloy film between the inside of the connection hole and the Al wiring layer.

To achieve the above object, a semiconductor device of the present invention comprises:

a insulating film formed on one principal plane of a semiconductor substrate and having a concave portion;

a liner film made of either of Nb and NbN formed in the concave portion;

an Al wiring layer mainly containing Al formed in the concave portion having the liner film; and a NbAl alloy formed on either of the interface between the liner film and the Al wiring layer and the interface between the insulating film and the Al wiring layer. Before the liner film made of one of Nb and NbN is formed in the concave portion, a barrier film may be formed so as to be positioned under the liner film.

Moreover, a semiconductor-device manufacturing method of the present invention comprises:

the first step of forming a interlayer-insulating film having a concave portion on a semiconductor substrate;

the second step of forming a liner film made of either of Nb and NbN in the concave portion;

the third step of forming an Al conductive film on a region including the inside of the concave portion while heating the semiconductor substrate, the conductive film being a Al conductive film mainly Al, and filling the inside of the concave portion with the Al conductive film by reflowing the Al conductive film, in which the second and third steps continuously form an NbAl alloy at the interface between the liner film and the conductive film in the third step in a vacuum state; and the fourth step of removing the conductive film from the outside of the concave portion and forming a wiring layer made of the conductive film.

Moreover, a semiconductor-device manufacturing method of the present invention comprises:

the step of forming a first conductive film on a semiconductor substrate, which includes the step of activating the migration of sputter particles on the semiconductor substrate by increasing the kinetic energy of the sputter particles serving as the first conductive film; and the step of forming a second conductive film on the first conductive film.

Furthermore, a semiconductor device of the present invention comprises:

a interlayer-insulating film formed on one principal plane of a semiconductor substrate and having a wiring groove;

a liner film formed on a semiconductor substrate and made of either of Nb and NbN formed in a wiring groove; and a damascene wiring obtained by embedding an Al wiring layer mainly containing Al formed on the inner wall of the wiring groove having the liner film in it, which meets the relation of A>B when assuming the half width of the rocking curve of the Al<111> peal of the damascene wiring obtained by incitenting to X-rays to vertical directions of the longitudinal damascene in the longitudinal wiring in accordance with the X-ray diffraction method as A and the half width of the rocking curve of the Al<111> peak of the damascene wiring obtained by incidenting X-rays to parallel directions of the longitudinal damascene wiring in accordance with the X-ray diffraction method as B.

According to the above structures, a semiconductor device and a manufacturing method thereof of the present invention make it possible to prevent the wiring resistance in a connection hole from increasing and the EM resistance from lowering, prevent the stage disconnection and agglomeration of Al, and improve the adhesiveness with the connection hole of the Al wiring layer by using a wiring structure in which an Al wiring layer is embedded in the connection hole formed on an interlayer-insulating film on one principal plane of a semiconductor substrate and using at least an Nb liner film and NbAl alloy film between the inside of the connection hole and the Al wiring layer, as compared with the conventional wiring structure.

Moreover, the present invention makes it possible to realize a semiconductor-device manufacturing method making it possible to fill the inside of a through-hole with an Al wiring layer capable of preventing the wiring resistance from increasing and the EM resistance from lowering even if an aspect ratio is raised by using an Nb liner film or NbN liner film.

Furthermore, according to the present invention, it is possible to prevent the hillock from occurring and the EM resistance from deteriorating by lowering the Al<111> orientation property on a predetermined plane of a damascene wiring and thereby, it is possible to realize a semiconductor device having a reliable damascene wiring.

Furthermore, the present invention makes it possible to form a first conductive film having a high orientation property by increasing the kinetic energy of sputter particles serving as a first conductive film and a second conductive film having a high orientation property by using the first conductive film having a high orientation property as a substrate and realize a semiconductor device having a wiring layer with a high EM resistance by using the second conductive film having a high orientation property as a wiring layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5C are illustrations for explaining that the agglomeration control performance of a liner film relates to the reaction between the liner film and an Al film;

FIG. 12 is an illustration showing the sputtering power dependency of half widths of rocking curves of Nb<110> peak and Al<111> peak measured by the X-ray diffraction method;

FIG. 13 is an illustration showing the relation between Al<111> orientation degree and EM reliability;

DETAILED DESCRIPTION OF THE INVENTION

Embodiments of the present invention are described below by referring to the accompanying drawings.

[First Embodiment]

FIGS. 3A to 3E are process sectional views showing the semiconductor-device manufacturing method of this embodiment of the present invention.

Figure 1:
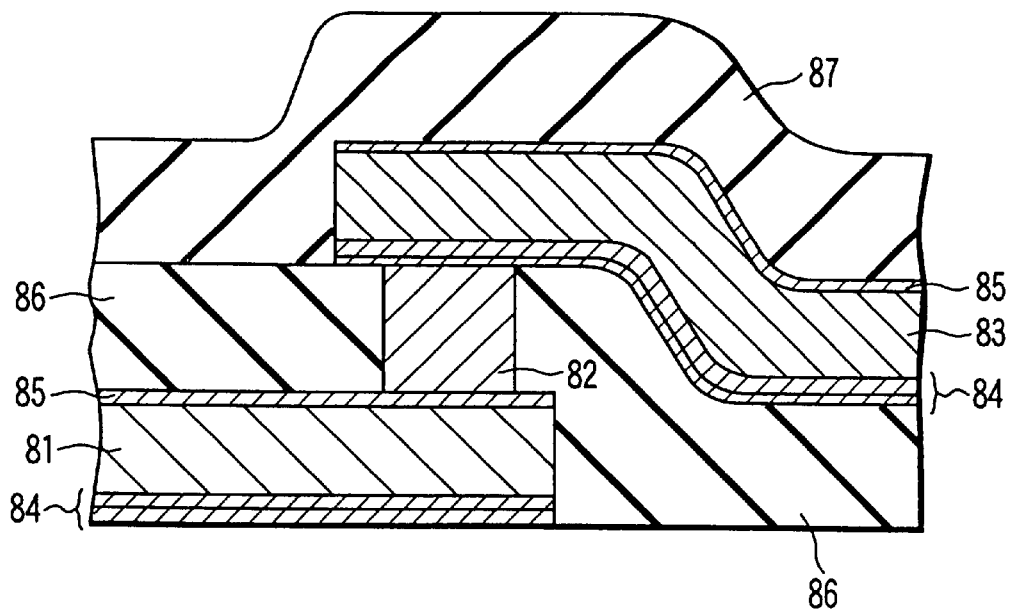
FIG. 1 is a local sectional view of a multilayer Al wiring formed by the conventional W-CVD art.
Figure 2:
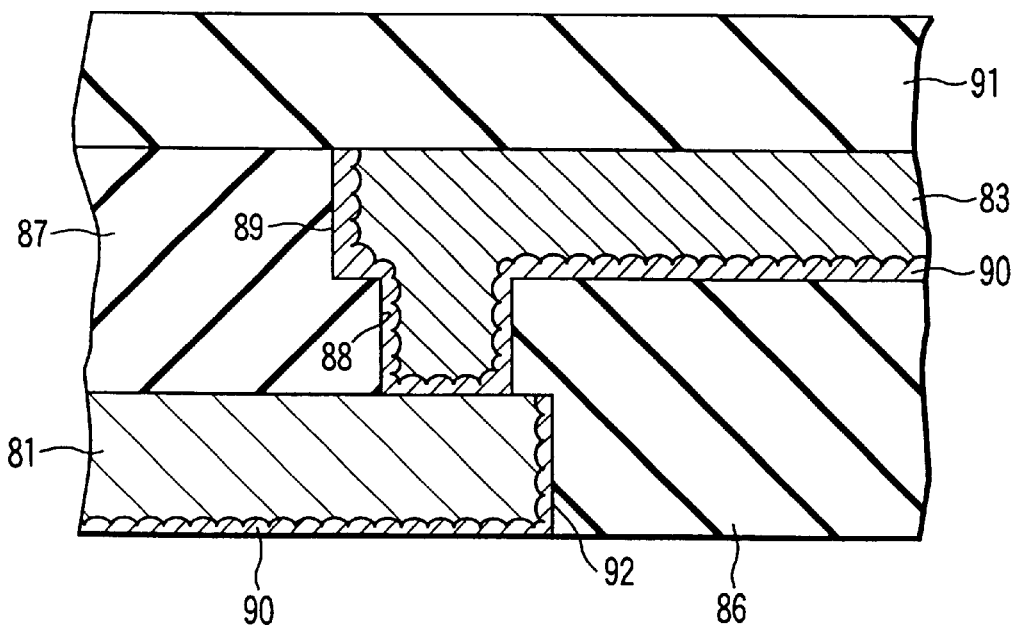
FIG. 2 is a local sectional view of a multilayer Al wiring formed by the conventional Al reflow art.
Figure 3A:
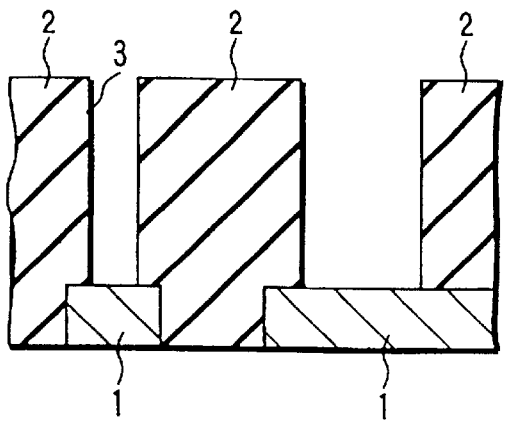
FIGS. 3A to 3E are process sectional views showing the semiconductor-device manufacturing method of the first embodiment of the present invention.

Also, as in FIG. 3A, an Al wiring 1 is formed on an Si substrate (not shown) on which a device is formed. In this case, it is unnecessary to use pure Al as the material of an Al wiring 1. For example, it is possible to use Al to which 0.5 wt % of Cu or 1 wt % of Si is added.

Then, an interlayer-insulating film 2 is formed so as to cover the Al wiring 1 on the entire surface and thereafter, a plurality of connection holes including connection holes 3 having an diameter of 0.3 μm or less and an aspect ratio of 3 or more (hereafter generally referred to as connection holes 3) are formed on the Al wiring 1 by means of photolithography and RIE.

Figure 3B:
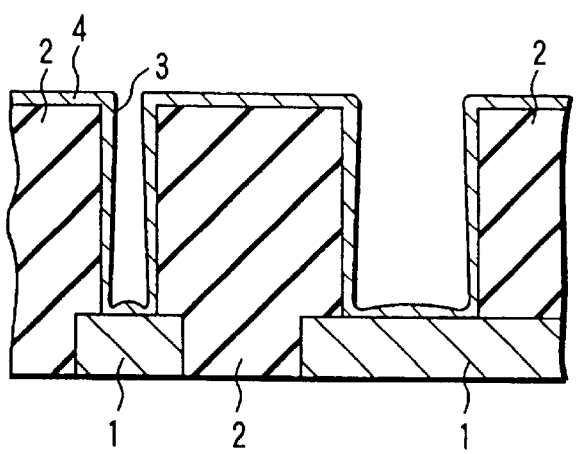

Then, as shown in FIG. 3B, an Nb liner film 4 is formed on a region including the connection hole 3 so as to cover the inner surface of the connection hole 3 by means of the directional sputtering method. The Nb liner film 4 has a thickness of 7.5 nm on the surface of an interlayer-insulating film 2.

Moreover, to evaluate the Al filling characteristic by the Nb liner film 4, the present inventor et al. formed a Ti liner film and a Ta liner film (not shown) at the same thickness as comparative examples.

Figure 3C:
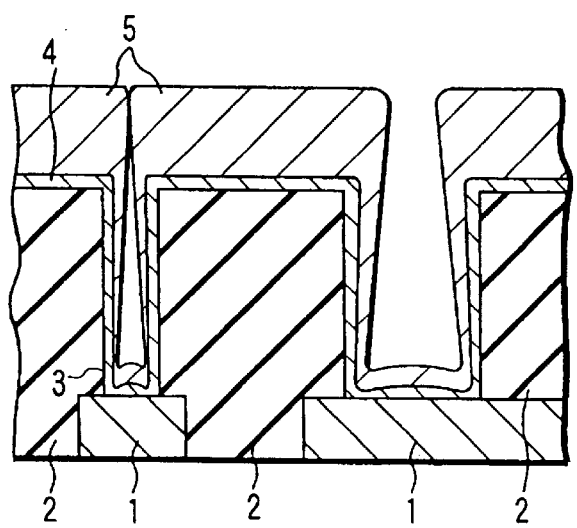

Then, as shown in FIG. 3C, a first Al film 5 having a thickness of, for example, 400 nm is formed without heating by means of the directional sputtering method without exposing an Si substrate to the atmosphere.

Figure 3D:
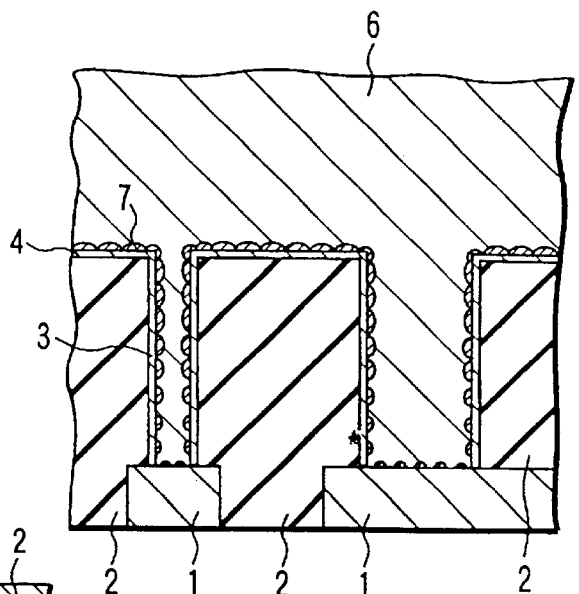

Then, as shown in FIG. 3D, a second Al film having a thickness of, for example, 400 nm is formed by means of the sputtering method for 180 to 300 seconds while keeping the Si substrate at, for example, 450° C. without exposing the Si substrate to the atmosphere to fill the inside of the connection hole 3 with first and second Al films 6. In this case, an AlNb alloy film 7 which is a reaction product of the Nb liner film 4 and the first Al film 5 is formed at the interfaces between the connection hole 3 and the first and second Al films 6.

Figure 3E:
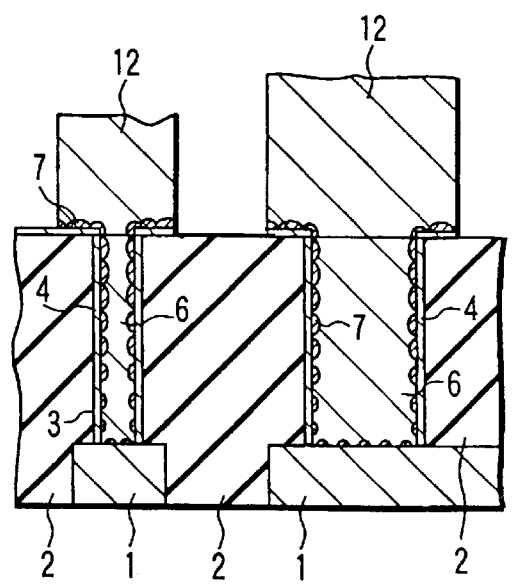

Finally, as shown in FIG. 3E, an Al wiring layer 12 and an Al contact layer 6 are completed by selectively removing the first and second Al film 6, AlNb alloy film 7, and Nb liner film 4 from the outside of the connection hole 3 by means of the RIE method.

In the above steps, it is possible to use, for example, a low-pressure long-throw sputtering method, collimation sputtering method, bias sputtering method, or high-density-plasma sputtering method as the directional sputtering method for forming the Nb liner film 4, first Al film 5, and first and second Al films 6.

Moreover, it is preferable that the Nb liner film 4 is uniformly formed on the inner surface of the connection hole 3. Furthermore, it is preferable that the first Al film 5 is formed at a high directivity. Therefore, when using, for example, the low-pressure long-throw sputtering method, it is possible to set a target diameter to 300 mm, a target-substrate distance to 300 mm, and an Ar-gas pressure to 0.03 Pa or lower.

From the research by the present inventors, it is found that the Nb liner film 4 and NbAl alloy film 7 formed at the interface between a connection hole and an Al wiring layer is able to completely control the increase of the wiring resistance differently from the Ti film and TiAl-alloy film formed at the interface between a connection hole and an Al wiring layer.

Therefore, this embodiment makes it possible to prevent the wiring resistance from increasing because there is not any film causing the wiring resistance to increase at the interface between the connection hole 3 and the Al contact layer 6.

Moreover, because either of the films 4 and 7 formed at the interface between the connection hole 3 and the Al contact layer 6 serves as a compensation conductor, it is possible to improve the EM resistance. Furthermore, because either of the Nb liner film 4 and AlNb alloy film 7 formed at the interface between the connection hole 3 and the Al contact layer 6 serves as a close-contact layer with the Al contact layer 6, it is also possible to improve the SM resistance.

Figure 4:
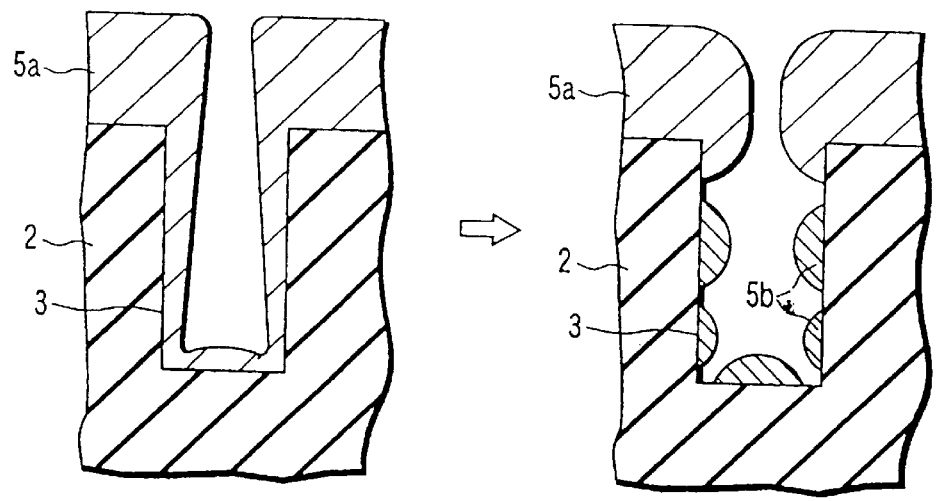
FIG. 4 is an illustration for explaining deterioration of the filling characteristic in reflow.

The deterioration of the filling characteristic in reflow is generally, as shown in FIG. 4, caused by the fact that the Al film 5a inside of the connection hole 3 out of the Al film 5a formed on the entire surface causes agglomeration in the beginning of reflow and thereby, an isolated Al grain 5b is formed and the path of Al diffusion is closed. An Nb liner film 4a has an effect for controlling the agglomeration of the Al film and thus, improves the filling characteristic.

From the study by the present inventors, it is found that the agglomeration control performance of a liner film is greatly related to the reaction between the liner film 4a and the Al film 5a. That is, as shown in FIGS. 5A and 5B, while the reaction between the liner film 4a and the Al film 5a progresses, agglomeration of the Al film 5a on the liner film 4a is controlled. However, as shown in FIG. 5C, when the liner film 4a entirely changes to a reaction product 8 with the Al film 5a, the agglomeration control performance decreases, so that the grained Al film 5b is formed.

Figure 6:
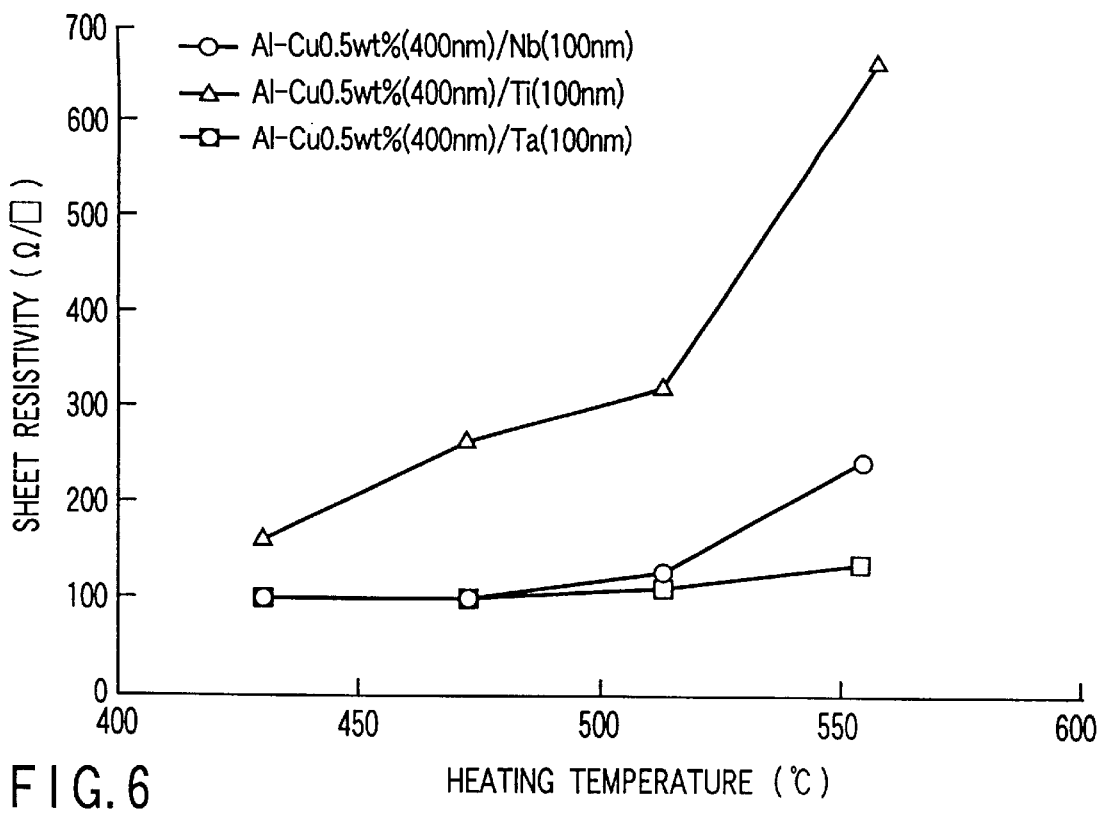
FIG. 6 is an illustration showing the relation between heat treatment temperature and sheet-resistivity rise rate when heat-treating a sample obtained by continuously forming an Al—Cu 0.5 wt % film on a Ta film and an Nb film under a vacuum state for 1 hour.

FIG. 6 shows the relation between heating temperature and sheet-resistivity rise rate when heat-treating a sample (laminated film) obtained by continuously forming Al—Cu 0.5 wt % film (thickness: 400 nm) on a Ti film, Ta film and Nb film (thickness: 100 nm) respectively under a vacuum state for one hour.

Each liner film and Al film form a reaction product due to a heat treatment and the effective Al film thickness decreases. Therefore, the reaction between the liner film and the Al film is further progressing as the sheet-resistivity rise rate increases. Therefore, from FIG. 6, it is found that the reactivity with the Al film rises in order of the Ti film, Nb film, and Ta film.

Table 1 shows the change of the filling characteristic of an Al film in accordance with the magnitude of an aspect ratio and the type of a liner film (Ti film, Ta film, or Nb film).

TABLE 1

| Liner material Aspect ratio | Ti | Nb | Ta |
| --- | --- | --- | --- |
| 1.0 | ◯ | ◯ | ◯ |
| 2.0 | ◯ | ◯ | ◯ |
| 2.5 | X | ◯ | ◯ |
| 3.0 | X | ◯ | ◯ |
| 3.2 | X | ◯ | ◯ |
| 3.4 | X | ◯ | X |
| 3.6 | X | ◯ | X |
| 3.8 | X | ◯ | X |

From Table 1, it is found that a Ti film having a high reactivity with an Al film and a Ta film having a low reactivity with the Al film respectively serving as a liner film deteriorates in the filling characteristic for a connection hole having a high aspect ratio. This result can be understood as described below.

First, a Ti liner film entirely changes to a reaction product in a short time because it has a high reactivity with an Al film. Therefore, the agglomeration-control-performance continuing time is shortened and therefore, it is impossible to secure the time for flowing the Al film through a connection hole. As a result, the Ti liner film deteriorates in the filling characteristic for a connection hole having a high aspect ratio compared to Nb and Ta liner films.

However, because the Ta liner film has a low reactivity with an Al film, it originally has a small capacity for controlling the agglomeration of the Al film in accordance with a reaction and thus, the filling characteristic deteriorates.

Moreover, because the Nb liner film has a long reaction time with the Al film and a function for controlling the agglomeration of the Al film in accordance with a reaction, it is possible to secure a sufficient time for flowing the Al film through a connection hole. As a result, it is possible to fill a connection hole having a high aspect ratio.

Thus, it is important to select a liner film used for Al reflow by considering the reactivity with an Al film.

Moreover, agglomeration of an Al film starts with the minimum-film-thickness portion between a liner film and the Al film. When forming a liner film and an Al film by the sputtering method, the bottom close to the side wall of a connection hole (hereafter referred to as a connection-hole side-wall bottom) serves as the minimum-film-thickness portion.

In the case of the sputtering method, a visual angle through which a sputter particle can enter at the connection-hole bottom decreases and the sputter particle attaching rate lowers. The visual angle is determined by the aspect ratio of a connection hole. A connection hole having a higher aspect ratio has a smaller visual angle and thicknesses of a liner film and an Al film at the connection-hole side-wall bottom decrease.

Therefore, to securely fill a desired connection hole through Al reflow using an Nb liner film, it is necessary to adjust the temperature and time of reflow, that is, a thermal budget (product of substrate temperature and heating time), thicknesses of an Nb liner film and an Al film at the bottom of a connection hole having the maximum aspect ratio on an Si substrate, and the volume in the connection hole as shown below.

That is, when an Al flow rate determined by the thermal budget (product of substrate temperature and heating time) is equal to or larger than a in-connection-hole volume except the regions occupied by an Nb liner film and an Al film formed before heated, thicknesses of the Nb liner film and Al film are adjusted so that either of the Nb liner film and Al film at the minimum-film-thickness portion does not disappear due to reaction (first adjustment).

A substrate temperature and a heating time are adjusted so that an Al flow rate becomes equal to or larger than an in-connection-hole volume except the regions occupied by an Nb liner film and an Al film formed before heated and a thermal budget in which either of the Nb liner film and Al film at the minimum-film-thickness portion does not disappear due to reaction (second adjustment).

Or, when a thermal budget in which either of the Nb liner film and Al film at the minimum-film-thickness portion does not disappear due to reaction is selected, an in-connection-hole volume is adjusted so that an Al flow rate becomes equal to or larger than the in-connection-hole volume except regions occupied by the Nb liner film and Al film formed before heated (third adjustment).

The method of this embodiment is a method selecting the first adjustment. In this case, it is confirmed that the connection hole 3 having an aperture diameter of 0.3 μm or less and an aspect ratio of 3 or more can be filled with the first and second Al films 6. Moreover, the above first to third adjustments are effective for other type of film. By meeting the adjustment condition, it is possible to fill the inside of a connection hole having a high aspect ratio with a conductive film independently of the type of liner film.

As described for this embodiment, to fill a connection hole with Al by means of reflow, it is important to make an Nb liner film react on Al in the reflow process and control agglomeration of a first Al film. Therefore, after reflow of the present invention, $Al_3Nb$ which is an alloy of Nb and AL is always formed. Particularly, when forming Nb by directional sputtering, Nb is thinly formed on a wiring groove and the side of a connection hole. Therefore, all the Nb at the side reacts on Al and an $Al_3Nb$ layer is formed and thereby, an Nb film may not be left after reflow.

However, it is also possible to prevent $Al_3Nb$ from being formed even if using the same Al reflow. For example, there is a case in which Nb is sputtered and thereafter, a substrate is temporarily released to the atmosphere and then first Al is formed at a low temperature and reflowed while forming a second Al film at a high temperature. In this case, a native oxide film is formed on the surface of the Nb and a slight Nb oxide layer is present at the interface between the Nb and Al. The Nb oxide layer controls the reaction between the Nb and Al but $Al_3Nb$ is hardly formed. In this case, because an alloy layer of the Nb and Al is not formed on the inner surface of the wiring groove, the amount of Al in the wiring groove substantially increases and thereby, it is possible to lower the wiring resistance.

However, as described for this embodiment, to fill a connection hole through Al reflow, it is necessary to make Nb react on Al. When controlling the reaction between the Nb and Al, a problem occurs that the connection hole cannot be filled. Moreover, when an Nb oxide layer is present at the interface between Nb and Al, an $Al_3Nb$ region which is a mixed region of the Al and Nb is eliminated and the adhesiveness between the Nb and Al deteriorates. The deterioration of the adhesiveness deteriorates stress migration resistance and electromigration resistance and the reliability may be deteriorated.

Moreover, even if continuously forming Nb and first and second Al films under a vacuum state by using such an apparatus as a cluster tool, the surface of the Nb is oxidized. The oxidation degree of the Nb surface is determined by the time required for carrying a wafer until a first Al film is formed after sputtering Nb or the atmospheric vacuum degree while carrying the wafer. According to the study by the present inventor, when the carrying (atmosphere from end of Nb sputtering up to start of forming first Al) vacuum degree is $5 \times 10^{-5}$ Pa or lower and the time from end of Nb sputtering up to start of forming fist Al is 5 minutes or less, a reaction between Nb and Al enough to control the agglomeration of a first Al film occurs and $Al_3Nb$ is formed. In the case of a condition other than the above mentioned, an Nb-surface oxide layer controls the reaction between Al and Nb but it does not substantially form $Al_3Nb$.

Therefore, the present invention makes it possible not only to continuously form a Nb film, first and second Al films under a vacuum state but also to improve the connection-hole filling performance and form the number of Al$_3$Nb layers enough to improve the structural reliability. It is to be noted that the formations of the films have been effected under the conditions of the above-mentioned carrying atmospheric vacuum degree and the carrying time.

Moreover, except when releasing Nb to the atmosphere after sputtering it or performing reflow under a carrying condition in which an oxide layer is formed on the surface of an Nb film, the reaction between Al and Nb may be controlled depending on the purity of a sputtering target for sputtering the Nb film. According to the study by the present inventor, by using an Nb target having a purity of 99.9% or more, it is possible to form the number of Al$_3$Nb layers enough to improve the connection-hole filling performance and the structural reliability.

When using an Nb target having a purity of less than 99.9%, impurity atoms contained in the target react on Al and thereby, the reaction layer may prevent the reaction between Nb and Al. Also in this case, it is impossible to fill a connection hole similarly to the case when an oxide layer is formed on the surface of Nb and it is impossible to improve the structural reliability because the amount of Al$_3$Nb is insufficient.

[Second Embodiment]

Figure 7A:
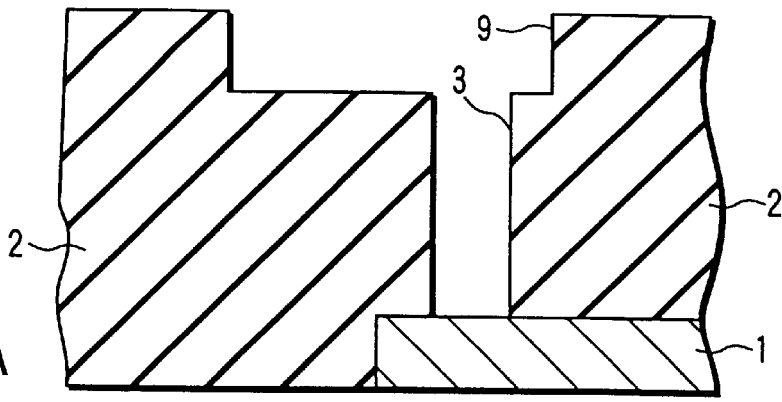
FIGS. 7A to 7C are process sectional views showing the semiconductor-device manufacturing method of the second embodiment of the present invention.
Figure 7B:
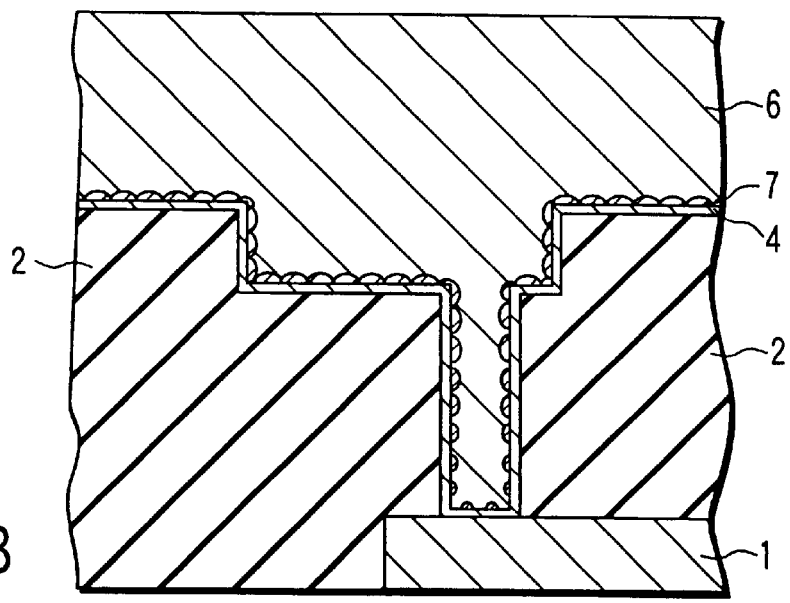
Figure 7C:
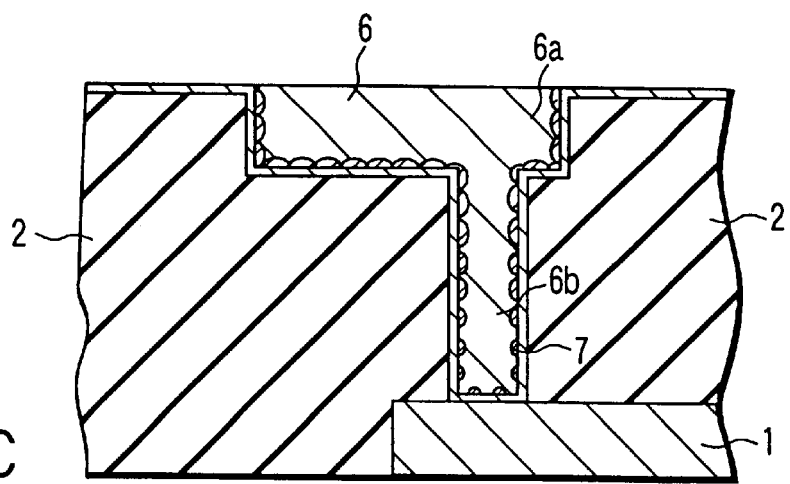

FIGS. 7A to 7C are process sectional views showing the semiconductor-device manufacturing method of the second embodiment of the present invention. For this embodiment, a case is described in which the Al reflow method using the Nb liner film described for the first embodiment is applied to a DD-wiring forming method. Moreover, this embodiment selects the second adjustment. Furthermore, a portion corresponding to those in FIGS. 3A to 3E is provided with the same symbol and its detailed description is omitted.

First, as shown in FIG. 7A, an Al wiring 1 is formed on an Si substrate (not shown) on which a device is formed.

Then, as shown in FIG. 7A, a interlayer-insulating film 2 is formed on the entire surface so as to cover the Al wiring 1 and thereafter, a connection hole 3 and a wiring groove 9 are formed on the interlayer-insulating film 2.

Then, as shown in FIG. 7B, an Nb liner film 4 and a first Al film respectively having a thickness of 7.5 nm are formed under the same condition as the case of the first embodiment and then, insides of the connection hole 3 and wiring groove 9 are filled with first and second Al films 6 by means of Al reflow at an Si-substrate heating temperature of 420° C. and a heating time of 300 seconds while the second Al film is formed. Moreover, it is possible to set the heating time to a value larger than 300 seconds.

Finally, as shown in FIG. 7C, by polishing and removing extra first and second Al films 6 from the outside of the connection hole and wiring groove 9 by means of the CMP method, a DD wiring 6 (second Al wiring 6a and Al plug 6b) is completed.

In general, the DD process for filling insides of the connection hole 3 and wiring groove 9 with an Al film by means of reflow has a problem that the wiring resistance is increased due to a liner film formed in the wiring groove and the reaction product of the liner film and Al film.

Because increase of the wiring resistance causes an RC delay, it is desired to control the wiring resistance to less than 4.6 $\mu\Omega\cdot$cm by converting the wiring resistance into a resistivity in the case of a wiring width of 0.18 $\mu$m.

Figure 8:
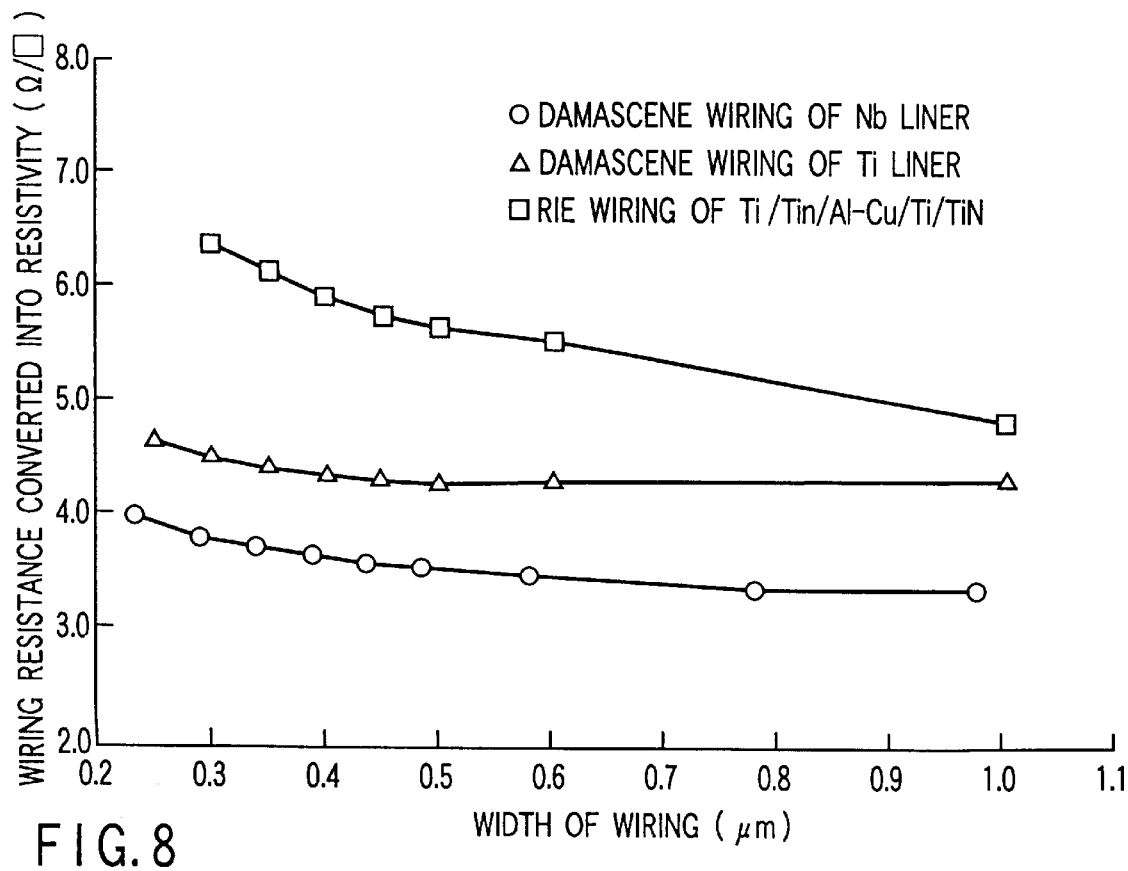
FIG. 8 is an illustration showing the relation between resistivity and wiring width of a conventional wiring formed through RIE, a wiring formed through reflow using a Ti liner film, and a wiring formed through reflow using an Nb liner film.

FIG. 8 shows the relation between resistivities and wiring widths of a conventional RIE wiring formed through RIE, a DD wiring formed through the Al reflow using a Ti liner film (comparative example), and a DD wiring formed through the Al reflow using the Nb liner film of this embodiment. In this case, the depth of a wiring groove is set to 400 nm.

Moreover, the thickness of the Ti liner film (comparative example) is set to 15 nm that is the same as that of the Nb liner film. In this case, however, the Ti liner film cannot fill a connection hole having an aperture diameter of 0.3 $\mu$m or less and an aspect ratio of 3 or more with an Al film.

From FIG. 8, it is found that rise of the resistivity of the DD wiring formed through the Al reflow using the Nb liner film of this embodiment is controlled compared to those of the conventional RIE wiring and the DD wiring formed with a Ti liner film.

Moreover, the DD wiring 6 formed through the Al reflow using an Nb liner film has an advantage that it is superior in EM resistance and SM resistance. This is because the AlNb alloy film 7 (e.g. Al$_3$Nb film) made of the reaction product between the Nb liner film 4 or first Al film and the Nb liner film 4 is superior in the EM resistance. Therefore, even if the DD wiring causes disconnection due to EM, current flows through the Nb liner film 4 or AlNb alloy film 7 and it is possible to control the disconnection of the DD wiring 6.

Furthermore, in the case of the DD wiring 6, an Al film is embedded in the connection hole of an interlayer-insulating film and a wiring groove. Therefore, the adhesiveness between the side of the Al film and the interlayer-insulating film is originally preferable compared to the case of the RIE wiring. Furthermore, in the case of this embodiment, because the AlNb alloy film 7 is formed at the interface between the side of the DD wiring 6 and the interlayer-insulating film 2 and it serves as an adhesive layer. Therefore, the adhesiveness is further raised and thereby, it is possible to improve the SM resistance.

As described above, because an Al$_3$Nb layer is present, the EM resistance and SM resistance are improved. The shape of Al$_3$Nb to be formed greatly influences the improvement of the reliability. When heating a substrate after forming an Nb/Al laminated film, an Al$_3$Nb layer formed at an interface is not formed on the film but it is formed granularly. Granularly-formed Al$_3$Nb has a large contact interface with Al compared to the case of Al$_3$Nb formed like a film. The increase of the contact interface improves the adhesiveness between Al and Al$_3$Nb and causes the EM resistance and SM resistance to be further improved.

[Third Embodiment]

FIGS. 9A to 9E are process sectional views showing the semiconductor-device manufacturing method of the third embodiment of the present invention. A portion corresponding to those in FIGS. 3A to 3E is provided with the same symbol and its detailed description is omitted. This embodiment is different from the first embodiment in that an NbN liner film is used instead of an Nb liner film.

Figure 9A:
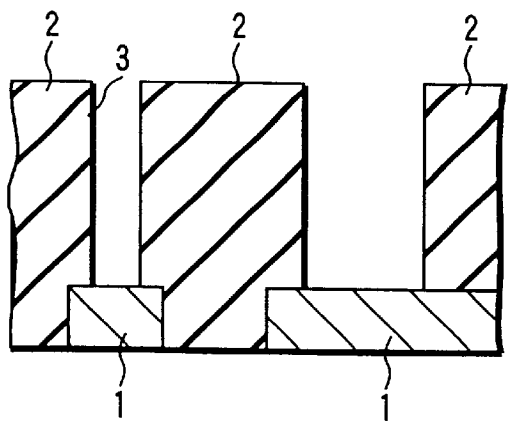
FIGS. 9A to 9E are process sectional views showing the semiconductor-device manufacturing method of the third embodiment of the present invention.

First, as shown in FIG. 9A, an Al wiring 1 and an interlayer-insulating film 2 are successively formed on an Si substrate (not shown) with a device formed on it, similarly to the first embodiment.

Then, as shown in FIG. 9A, a plurality of connection holes respectively having an aperture diameter of 0.3 $\mu$m or less and an aspect ratio of 3 or more (hereafter generally referred to as connection hole 3) are formed on the interlayer-insulating film 2.

Figure 9B:
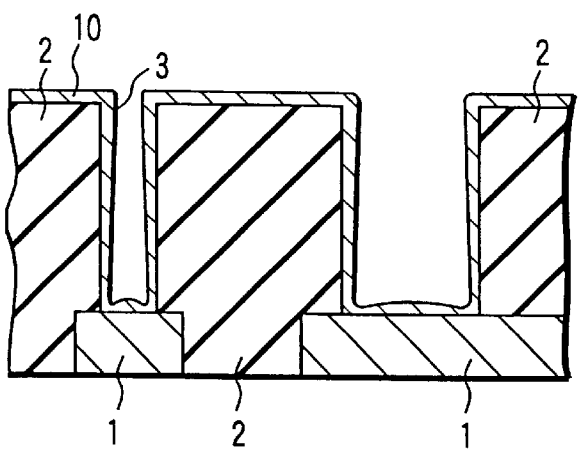

Then, as shown in FIG. 9B, an NbN liner film 10 having a thickness of 15 nm is formed on the surface of the interlayer-insulating film 2 by using the directional sputtering method. Specifically, for example, the NbN liner film 10 is formed through reactive sputtering in a mixed gas of Ar gas and N$_2$ gas by using an Nb target.

Figure 9C:
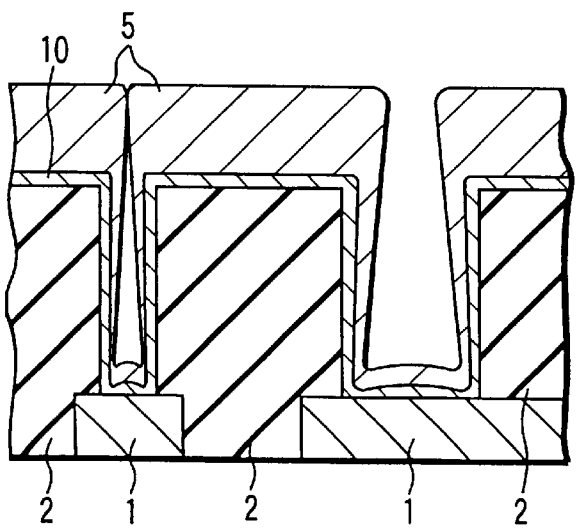

Then, as shown in FIG. 9C, a first Al film 5 having a thickness of, for example, 400 nm is formed with no heat through the directional sputtering method without exposing the Si substrate to the atmosphere.

Figure 9D:
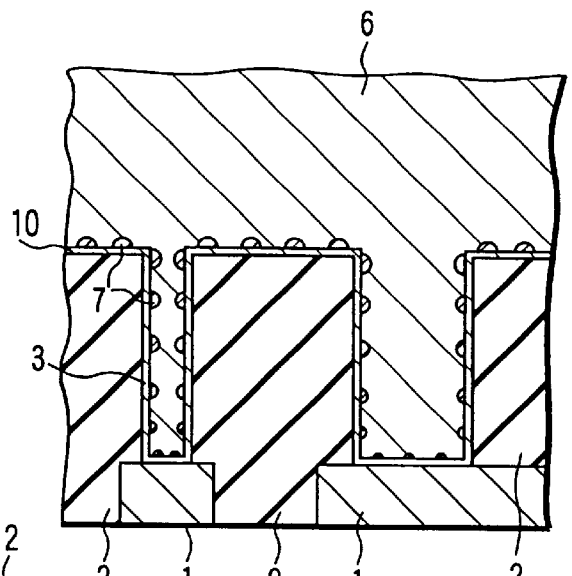

Then, as shown in FIG. 9D, a second Al film having a thickness of, for example, 400 nm is formed through the sputtering method for 180 to 300 seconds while keeping an Si substrate at, for example, 450° C. without exposing the Si substrate to the atmosphere to fill the inside of the connection hole 3 with first and second Al films 6.

Figure 9E:
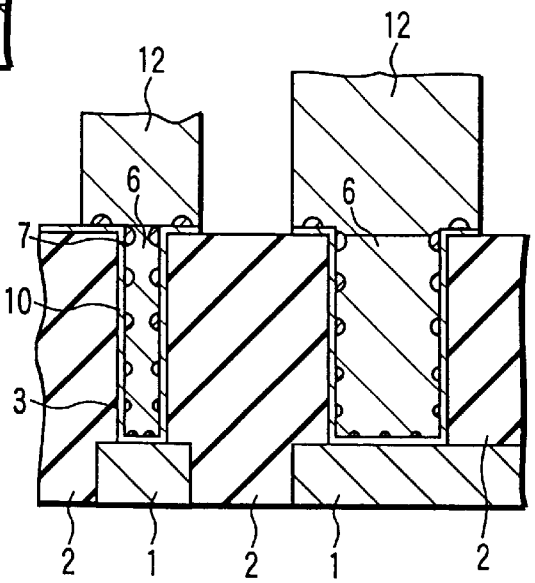

Finally, as shown in FIG. 9E, an Al contact layer 6 and an Al wiring are completed by selectively removing the first and second Al films 6, AlNb alloy film 7, and NbN liner film 10 from the outside of the connection hole 3 by using the RIE method.

In this case, it is also possible to use the low-pressure long-throw sputtering method, collimation sputtering method, bias sputtering method, or high-density-plasma sputtering method as the directional sputtering method for forming the NbN liner film 10 or first Al film 5. Also, in this case, it is necessary to perform sputtering in a mixed gas of Ar gas (other rare gas) and $N_2$ gas.

Advantages same as those of the first embodiment can be also obtained from this embodiment. However, this embodiment is superior in the following points compared to the case of using an Nb liner film as described below.

When using the reactive sputtering method, it is possible to easily adjust the nitrified quantity of an NbN liner film by changing mixing ratios of Ar gas and $N_2$ gas under sputtering.

Nb atoms not combined with N atoms are present in a formed NbN film and the uncombined Nb atoms react on Al atoms. Therefore, by controlling the nitrified quantity of the NbN liner film, it is possible to control the reaction rate between an NbN liner film and an Al film and continue the agglomeration control performance compared to an Nb liner film having the same thickness.

Therefore, by controlling the nitrified quantity of an NbN liner film, it is possible to control a reaction having a reaction rate larger than the reaction rate necessary for controlling the agglomeration of an Al film, that is, it is possible to control the consumption of the NbN liner film at the minimum-film-thickness portion at the bottom of a connection hole and fill a connection hole having a high aspect ratio compared to the case of an Nb liner film having the same thickness. Or, in the case of connection holes having the same aspect ratio, it is possible to fill the connection holes with an NbN liner film having a thickness smaller than that of an Nb liner film.

Moreover, a Ti liner film has a problem that an alloy spike is produced due to substrate heating under reflow when using the film for a connection hole to be directly connected to the diffusion region of an Si substrate.

Therefore, it is necessary to form a diffusion barrier-metal film such as a Ti film before forming the Ti liner film. However, an NbN liner film is superior in the diffusion barrier property for Al and Si. Therefore, when using the NbN liner film for a connection hole to be directly connected to the diffusion region of an Si substrate, it is possible to prevent an alloy spike from occurring. Also, if the N quantity of the NbN film is adjusted as the barrier metal, a reaction between the Nb and the Al in the NbN film may be reduced in some cases. In this case, in order to secure the reaction quantity with the Al, a Nb film is laminated on the NbN film.

[Fourth Embodiment]

Figure 10A:
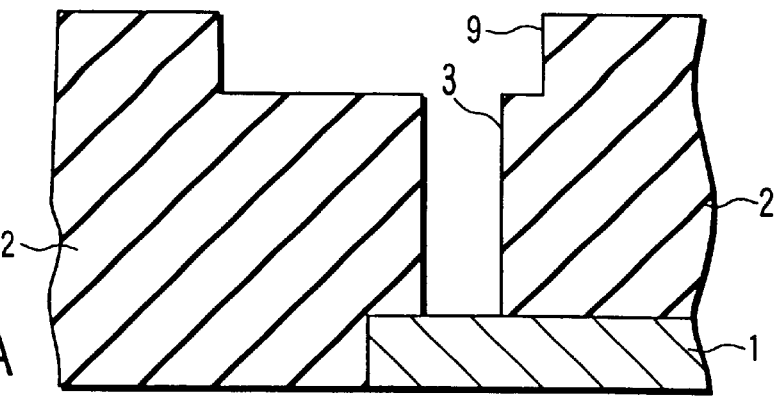
FIGS. 10A to 10C are process sectional views showing the semiconductor-device manufacturing method of the fourth embodiment of the present invention.
Figure 10B:
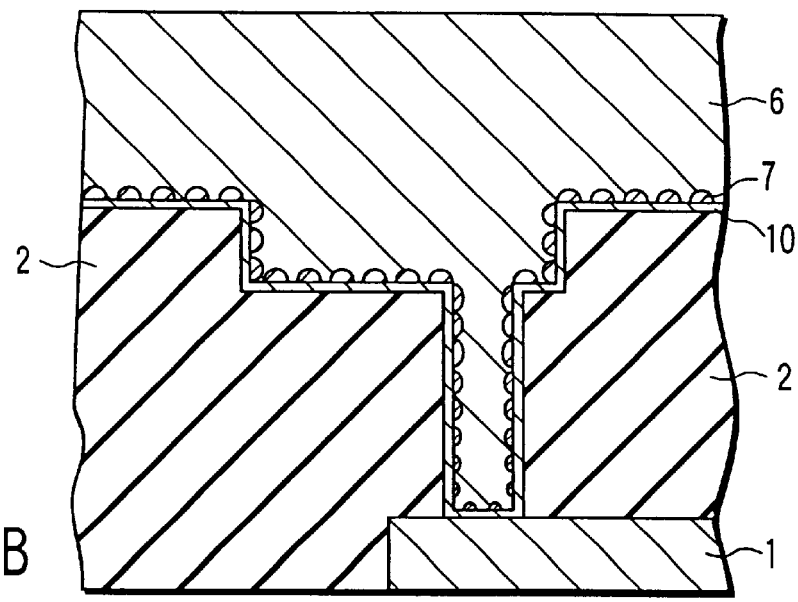
Figure 10C:
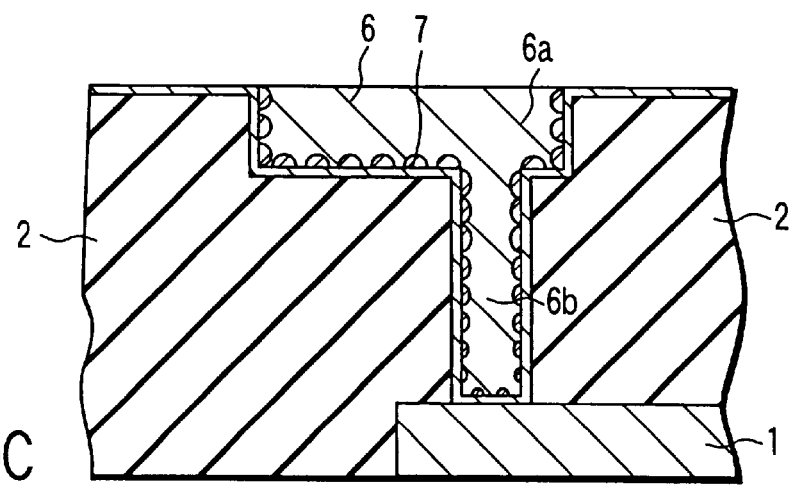

FIGS. 10A to 10C are process sectional views showing the semiconductor-device manufacturing method of the fourth embodiment of the present invention. For this embodiment, a case is described in which the Al reflow method using an NbN liner film described for the third embodiment is applied to the DD-wiring forming method. A portion corresponding to those in FIGS. 3A to 3E and FIGS. 9A to 9E is provided with the same symbol and its detailed description is omitted.

First, as shown in FIG. 10A, an Al wiring 1, interlayer-insulating film 2, connection hole 3, and wiring groove 9 are formed on an Si substrate (not shown) with a device formed on it similarly to the case of the third embodiment. Then, as shown in FIG. 10B, an NbN liner film 10 and a first Al film are formed under the same condition as the case of the first embodiment and thereafter, insides of a connection hole 3 and a wiring groove 9 are filled with first and second Al films 6 by means of Al reflow while forming a second Al film.

Finally, as shown in FIG. 10C, a DD wiring 6 (second Al wiring 6a and Al plug 6b) is completed by polishing and removing the extra first and second Al films 6 and the like on outsides of the connection hole 3 and wiring groove 9 by using CMP.

Advantages same as those of the second embodiment can be also obtained from this embodiment. Moreover, the reaction rate between an Nb liner film and an Al film can be decreased compared to the reaction rate between an Nb liner film and an Al film. Therefore, it is possible to decrease the thickness of the NbN liner film 10 and further decrease the wiring resistance. Moreover, it is possible to decrease the amount of an AlNb alloy film 7 formed on the connection hole 3 and wiring groove 9 and thereby, it is possible to further decrease the wiring resistance.

[Fifth Embodiment]

FIGS. 11A to 11F are process sectional views showing the semiconductor-device manufacturing method of the fifth embodiment of the present invention.

Figure 11A:
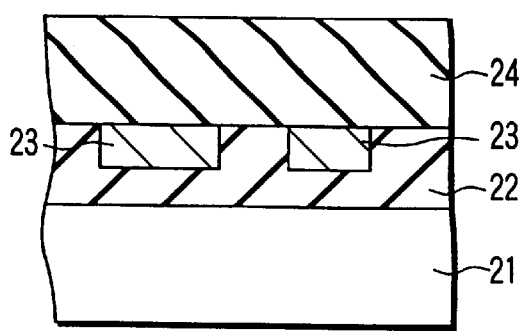
FIGS. 11A to 11F are process sectional views showing the semiconductor-device manufacturing method of the fifth embodiment of the present invention.

First, as shown in FIG. 11A, a first wiring layer 23 is formed on an Si substrate with a device (not shown) formed on it through a fist interlayer-insulating film 22. The first wiring layer 23 is, for example, a W wiring or Al wiring. Moreover, the first wiring layer 23 is a damascene wiring.

Then, as shown in FIG. 11A, a second interlayer-insulating film 24 is formed on the first interlayer-insulating film 22 and the first wiring layer 23. In this case, the second interlayer-insulating film 24 is a CVD insulating film formed through the plasma CVD using TEOS as a source gas, an F-added low-permittivity insulating film formed through the HDP-CVD, or a spin coated insulating film such as an organic SOG film.

When combining Al reflow using an Nb liner of the present invention with a low-permittivity insulating film such as an F-added $SiO_2$ film or an organic SOG film, an advantage on process that the filling performance is not deteriorated compared to the case of using Ti or Ta as a liner and an advantage on a structure that a low-permittivity insulating film closely contacts with an Nb or $Al_3Nb$ layer to improve the reliability are obtained.

In general, an F-added $SiO_2$ film and an organic SOG film produce much released gas while heated. A release gas mainly contains water. When using Ti or Ta for a liner, the liner material is oxidized by released water. The oxidized liner material deteriorates the effect for controlling a reaction with Al and controlling the agglomeration of first Al and the effect for improving the adhesiveness between Al and a low-permittivity insulating film. Therefore, when using a low-permittivity insulating film and Ti or Ta by combining them, there are a problem on process that the filling performance for a connection hole is greatly deteriorated and a problem on structure that the reliability is deteriorated.

However, Nb has a high standard-generation free energy for forming oxide and a high oxidation resistance compared to Ti or Ta. Therefore, Nb is not easily changed in quality by the water released from a low-permittivity insulating film and it is able to keep the property as a liner, improve the filling performance for a connection hole, and secure the reliability.

Figure 11B:
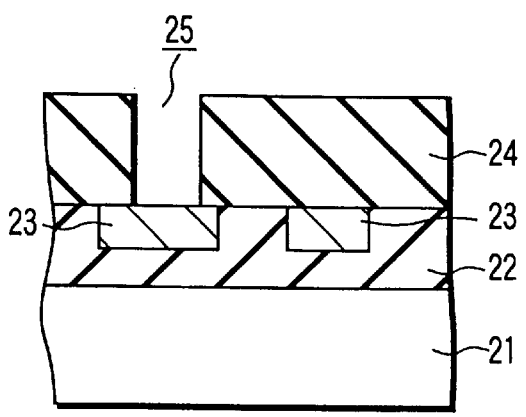

Then, as shown in FIG. 11B, a connection hole 25 to be connected with the first wiring layer 23 is formed on the first interlayer-insulating film 24 through photolithography and RIE.

Hereafter, a method is described that continuously forms an Nb liner film, first Al film, and second Al film in order and flows first and second Al films to fill the inside of the connection hole 25 with Al by using a cluster tool constituted by connecting a loading/unloading chamber (sample preparation chamber), degassing chamber, reverse-sputtering chamber, Nb sputtering chamber, first Al sputtering chamber, second Al sputtering chamber, and substrate cooling chamber with a carrying chamber (FIGS. 9C and 9E). Movement between chambers is performed via the carrying chamber.

First, a PBN heater provided with an electrostatic chuck is used for degassing. That is, degassing is performed by heating a substrate for 2 minutes or more in a temperature range of 300 to 450° C. by the PBN heater.

In this case, it is also possible to use a halogen-lamp heater instead of the PBN heater. Moreover, the degassing chamber has an independent exhaust system so that the base vacuum degree of the carrying chamber is not deteriorated by the gas released from the substrate in the degassing step.

Then, in the reverse-sputtering chamber, the native oxide film on the surface of the first wiring layer 23 exposed to the bottom of the connection hole 25 and the dirt attached when the connection hole 25 is formed are removed through reverse-sputtering. It is possible to perform the reverse sputtering by a parallel-plate-type or inductive-coupling-type plasma sputtering system.

When the first wiring layer 23 is a W wiring layer etc, it is possible to remove a native oxide film and the dirt attached when forming the connection hole 25 through cleaning with organic alkali solution. Therefore, it is unnecessary to perform reverse sputtering.

Figure 11C:
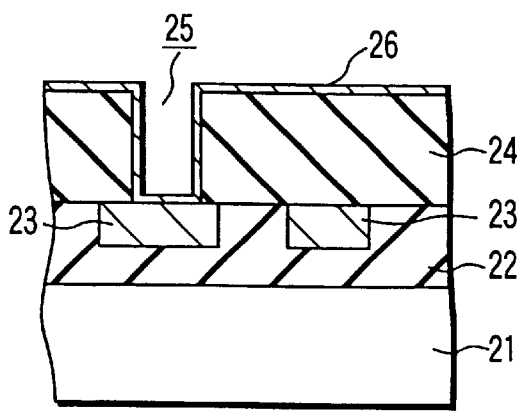

Then, as shown in FIG. 11C, an Nb liner film 26 having a thickness of 7.5 to 50 nm is formed by the long-throw sputtering method so as to cover the entire inner surface of the connection hole 25.

In this case, the diameter of an Nb target is set to approx. 300 mm, the distance between the Nb target and the substrate is set to 300 mm, the input power is set to 8 kW or more, and the Ar pressure is set to 0.02 to 0.1 Pa. Moreover, the substrate is not heated or it is cooled in order to avoid a temperature rise of the substrate under sputtering.

Figure 11D:
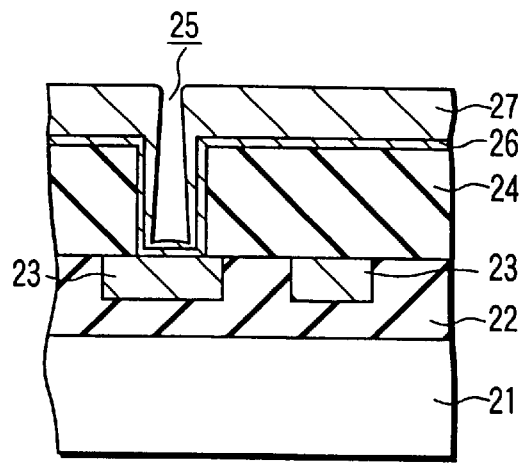
Figure 11E:
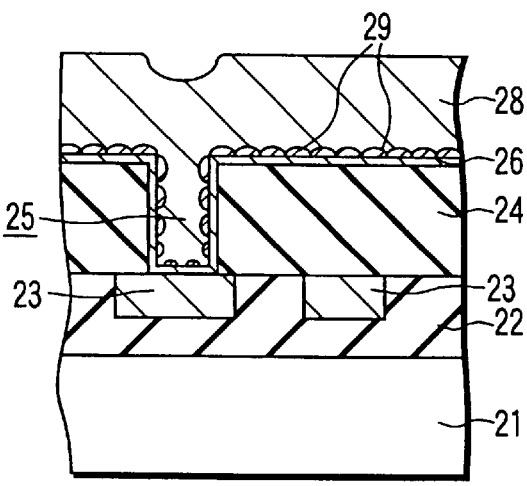

Then, as shown in FIG. 11D, a first Al film 27 having a thickness of 250 to 700 nm serving as a second Al-wiring layer is formed by the long-throw sputtering method so as to cover the entire inner surface of the connection hole 25.

In this case, the diameter of an Al target is set to approx. 300 mm, the distance between the Al target and the substrate is set to 300 mm, the input power is set to 10 kW or more, and the Ar pressure is set to 0.01 to 0.1 Pa. Moreover, the substrate is not heated or it is cooled in order to avoid a temperature rise of the substrate under sputtering.

Then, as shown in FIG. 11, a second Al film having a thickness of 50 to 600 nm serving as a second wiring layer is formed at a film-formation rate of 3.33 nm/second by the standard sputtering method while keeping an Si substrate at 430 to 495° C. and the inside of the connection hole 25 is filled with first and second Al films 28 by flowing the first and second Al films 28. The standard sputtering method is a method for performing sputtering by using an Al target having a diameter of approx. 300 mm and setting the distance between the target and the substrate to 60 mm.

In this case, an AlNb alloy film 29 which is a reaction product of the Nb liner film 26 and first Al film 27 is formed at the interfaces between the connection hole 25 on one hand and the first and second Al films 28 on the other.

In the above case, a second Al film is formed through the standard sputtering method. However, by using the same setting film-formation rate, that is, by using a film-formation rate of 3.33 nm/seconds, there is no problem in forming the second Al film through the long-throw sputtering method.

Figure 11F:
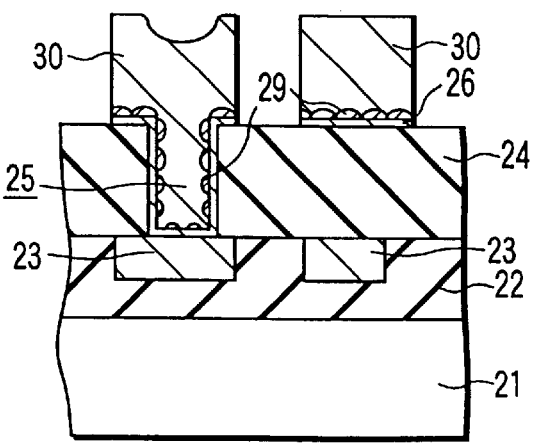

Finally, as shown in FIG. 11F, by treating the first and second Al films 28, AlNb alloy film 29, and Nb liner film 26 through photolithography and RIE, a second Al-wiring layer 30 is completed.

From the study by the present inventor et al., it is clarified that, by forming an Nb film at a high sputtering power, the <110> orientation in the axial direction vertical to the substrate surface of the Nb film (hereafter referred to as a substrate vertical-axial direction) is improved. Moreover, it is clarified that an Al film formed on the <110>-oriented Nb film shows very superior <111> orientation in the substrate vertical direction.

FIG. 12 shows the sputtering power dependency on half width of rocking curves of the Nb<110> peak of an Nb film and the Al<111> peak of an Al film formed on the Nb film measured by the X-ray diffraction method.

From FIG. 12, it is found that as the sputtering power increases, the Nb<110>-peak half width decreases and the Al<111>-peak half width also decreases. That is, it is shown that as a peak half width decreases, the orientation degree in the bearing rises.

The surface of the Nb film having a high <110> orientation is the (110) plane and the grid constant of the Nb on this plane is close to the Al grid constant of the Al(111) plane. As a result, it is estimated that an Al film takes over the crystal structure of an Nb film and the Al film is oriented to <111>.

Moreover, from FIG. 12, it is found that the Nb<110> orientation property and Al<111> orientation property are deteriorated at an edge portion compared to the central portion of a wafer having a diameter of 200 mm. This may depend on the fact that the travelling direction of Nb sputtering particles tilts from an axis vertical to the surface of a substrate.

The long-throw sputtering method used to form an Nb film has an asymmetry to the travelling direction of a sputtering particle when the area of a target is not large enough compared to the area of a wafer and thereby, the diagonal incident component increases at the edge of the wafer.

Therefore, it is estimated that the diagonal component deteriorates the orientation property of an Nb film and resultantly, deteriorates the orientation property of an Al film. However, the dispersion of the orientation property in the wafer surface is also moderated as the sputtering power is increased.

An Al wiring is further superior in electromigration resistance as the <111> orientation property rises. This is because unstable crystal grain boundaries having a large diffusion coefficient are decreased in the case of an Al film having a high <111> orientation property.

FIG. 13 shows the relation between Al<111> orientation degree and EM reliability. The vertical-axis shows the lifetime until an Al wiring results in disconnection under an acceleration test at a high temperature and a high current density.

From FIG. 13, it is found that the EM resistance of an Al wiring is improved as the <111> orientation property rises, that is, the half width decreases.

A relation of $\tau$ $(1/\omega)^2$ is experimentally present between Al<111>-peak half width $\omega$ and EM life time $\tau$. In FIG. 13, the black circle denotes the orientation degree of an Al wiring of an LSI on a Ti/TiN film conventionally used for the substrate of the Al wiring.

From FIGS. 12 and 13, it is found that an orientation degree higher than that of a conventional Al wiring can be obtained on the entire surface of a wafer by sputter-forming an Nb liner film at a sputtering power of 8 kW or more.

In other words, it is found that an orientation degree higher than that of a conventional Al wiring can be obtained when the Al<111>-peak half widths of an Nb film and an Al film are 5.21° or less, when the Al<111>-peak half width becomes 1.92° or less.

The sputtering power is obtained as a product between voltage and current and changed depending on a target diameter, target-substrate distance, or Ar pressure. Therefore, the sputtering power is not a univocal parameter of the orientation property of an Nb film or Al film.

An Nb film is oriented to <110> due to the growing process of the Nb film under Nb sputtering. That is, an Nb particle (Nb-sputtering particle) having a kinetic energy emitted from a target by Ar$^+$ ions migrates on a substrate because of the kinetic energy when colliding with the substrate.

Therefore, as the migration distance increases, the Nb particle can migrate to a more stable site and grow while surfacing the <110> plane that is a stable crystal plane. That is, as the kinetic energy of a coming Nb particle while flying increases, Nb can be more easily <110>-oriented.

The kinetic energy of the Nb particle is attracted by a negative voltage applied to a target. Therefore, as the absolute value applied to the target rises, the kinetic energy of Nb increases.

Figure 14:
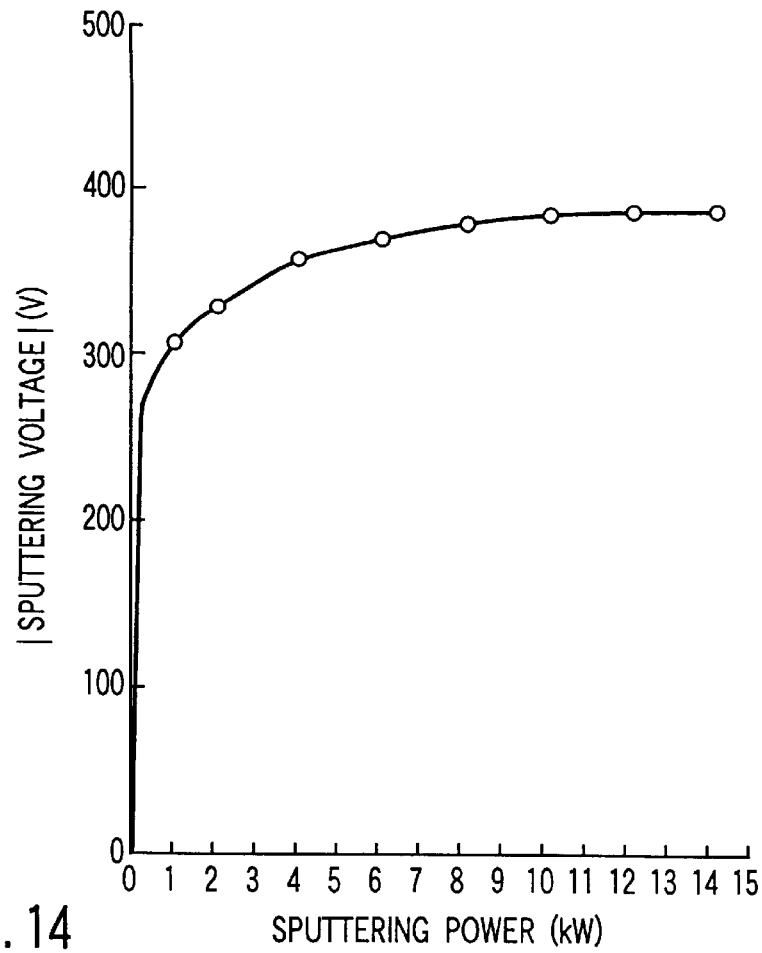
FIG. 14 is an illustration showing the relation between sputtering power and sputtering voltage.

FIG. 14 shows the relation between sputtering voltage (target voltage) and sputtering power. From FIG. 14, it is found that as the sputtering power increases, the absolute value of the sputtering voltage rises.

Moreover, from FIGS. 12, 13, and 14, it is found that by setting a target voltage to −380V or lower, the Al<111> orientation degree can be made higher than that of a conventional Al wiring.

In general, by increasing a sputtering power, a film-formation rate increases. In the case of the thin Nb liner film 26 having a thickness of 7.5 to 50 nm used for this embodiment, if the Nb liner film 26 is formed at a large sputtering power, it is impossible to accurately control the film thickness because the sputtering rate is large and as a result, a problem occurs that a film thickness differs in wafers or dispersion of film thickness occurs in the same wafer plane.

Figure 15:
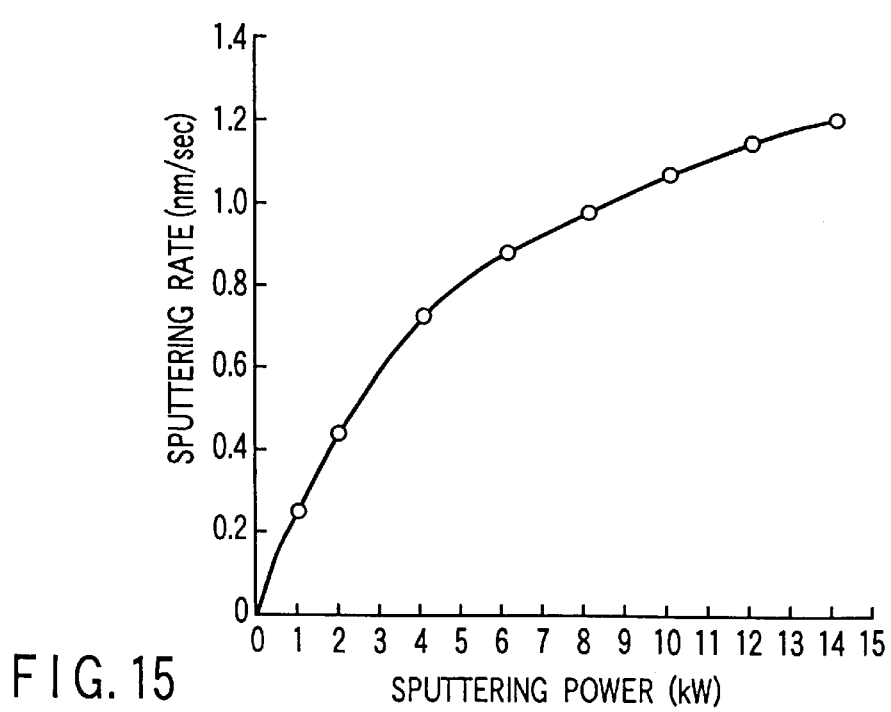
FIG. 15 is an illustration showing the relation between sputtering power and sputtering rate (film-forming rate) when forming an Nb film.

FIG. 15 shows the relation between sputtering power and sputtering rate (film-formation rate) for forming an Nb film. From FIG. 15, it is found that the sputtering rate does not increase proportionally to the sputtering power but it shows the trend of leveling off even by increasing the sputtering power.

Even in the case of a sputtering power corresponding to a target voltage of −380V or lower at which the Nb<110> orientation property becomes practical, the sputtering rate ranges between 1 and 1.3 nm/second and there is a sufficient controllability even in forming a film having a thickness of 7.5 to 50 nm.

According to the study by the present inventor et al., because increasing the kinetic energy of an Nb particle colliding with a substrate is the essence for improving the orientation property, it is not always necessary to control a kinetic energy by a target voltage.

That is, some of sputtering particles are changed to cautions under sputtering. Therefore, by applying a negative voltage to a substrate, ionized Nb particles are accelerated and attracted into the substrate without increasing a target voltage. Thus, the kinetic energy of an Nb particle increases.

Higher effect can be obtained by improving the ionization efficiency with inductive-coupling-type plasma or the like. Even by using the above method, it is possible to highly orient the Nb liner film 26 and resultantly, the orientation property of the second Al-wiring layer 30 is improved and the wiring reliability is also improved.

However, to attract Nb particles including some ionized Nb particles by applying a bias to a substrate and improve the orientation property, it is necessary to pay attention to the following.

For example, when applying a bias to a substrate as performed by the bias sputtering method, Ar of an ionized sputtering gas is also attracted into the substrate and captured into the Nb liner film 26.

The Ar captured into the Nb liner film 26 and thereafter, discharged from the Nb liner film 26 due to the heat treatment in the heating step for reflow in a subsequent step or sintering step after forming the second Al-wiring layer 30, and peeling occurs at the interface between the Nb liner film 26 and the second Al-wiring layer 30.

To prevent the peeling, it is necessary to decrease the flow rate of Ar and decrease the amount of Ar captured into the Nb liner film 26.

Moreover, in the case of formation of an Nb film through the bias sputtering method, a function for applying RF power to a substrate is necessary and thereby, the system cost increases. Furthermore, the bias sputtering method is a film-formation technique in which film formation and etching occur at the same time. Therefore, a film-formation rate lowers and throughput also lowers.

Furthermore, by applying a substrate bias from the beginning of film formation and a part of a interlayer-insulating film ($SiO_2$ film) is etched and etched $SiO_2$ is captured into the Nb liner film 26 to probably deteriorate the quality of the Nb liner film 26.

From these viewpoints, it can be said that the method of this embodiment capable of highly orienting the Nb liner film 26 only by adjusting the voltage of a target and improving the orientation property of the second Al-wiring layer 30 is a simple method compared to the bias sputtering method and a method of applying a substrate bias to attract Nb ions.

Moreover, lowering the gas pressure under Nb sputtering is effective to increase the absolute value of a pressure to be applied to a target.

For example, in the case of the long throw sputtering at a target diameter of 300 mm and a target-substrate distance of 300 mm, the target voltage is −330V at an Ar pressure of 0.053 Pa when the sputtering power is 2 kW. However, at an Ar pressure of 0.026 Pa, the absolute value of the target voltage rises up to −397V.

The Al<111>-peak half width at the Ar pressure of 0.026 Pa and the target voltage of −397V is equal to 1.4° that is an orientation property high enough to improve the EM resistance.

Moreover, in the case of the long throw sputtering, by lowering Ar-gas pressure, scattering of Nb sputtering particles due to Ar gas is controlled and thereby, the directivity of Nb sputtering particles is improved.

In the case of the connection hole 25 having a high aspect ratio, it is necessary to form the liner film 26 up to the bottom of the sidewall of the connection hole. Improvement of the directivity of Nb sputtering particles increases the probability for Nb sputtering particles to enter the bottom of the sidewall of a connection hole and resultantly makes it possible to fill a connection hole having a high aspect ratio with Al.

Moreover, increase of the kinetic energy of Nb sputtering particles improves the characteristic of filling the connection hole 25 with Al. That is, by using the Nb liner film 26 formed with Nb sputtering particles having higher kinetic energy, it is possible to fill the connection hole 25 having higher aspect ratio with the second Al-wiring layer 30.

Figure 16:
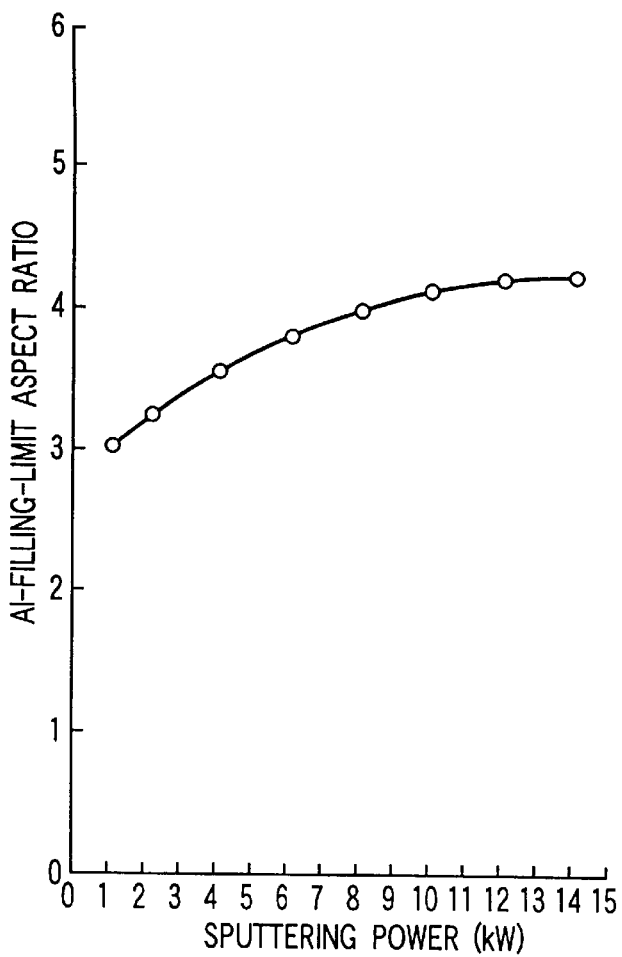
FIG. 16 is an illustration showing the relation between Nb sputtering power and Al-filling-limit aspect ratio.

FIG. 16 shows the relation between Nb sputtering power and maximum aspect ratio of a connection hole that can be filled with Al (hereafter referred to as Al-filling-limit aspect ratio).

From FIG. 16, it is found that as the Nb sputtering power increases, the Al-filling-limit aspect ratio increases. An Nb liner film 27 is formed to control the agglomeration of the first and second Al films 28. Therefore, it is necessary to form the film 27 at the side and bottom of the connection hole 25.

As described above, by increasing the kinetic energy of an Nb sputtering particle, movement of the Nb sputtering particle in a substrate is accelerated. Therefore, the property for the Nb liner film 26 to cover the connection hole 25 is improved.

Improvement of the covering property of the Nb liner film 26 makes it possible to control the agglomeration of the first and second Al films 28 and improve the aspect ratio of the connection hole 25 which can be filled through Al reflow.

Moreover, the Al<111> plane has the minimum surface energy compared to other crystal planes of Al and diffusion of Al atoms is activated on the surface of a film. Therefore, the flowability of a <111>-oriented Al film is improved.

Therefore, by increasing the kinetic energy of an Nb sputtering particle, it is possible to improve the covering property and Al flowability of the Nb liner film 26 on the inner surface of the connection hole 25. Thus, as a synergistic effect, the Al filling characteristic is greatly improved and it is possible to easily fill the inside of the connection hole 25 having a high aspect ratio with the first and second Al films 28.

Figure 21:
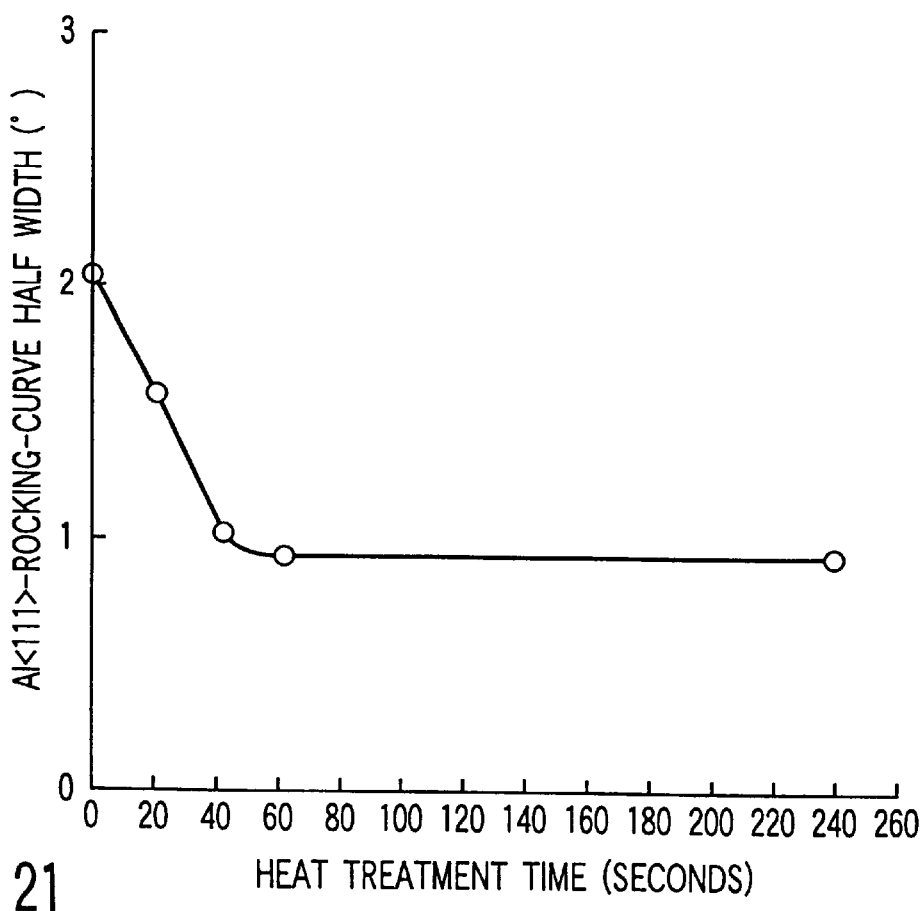
FIG. 21 is an illustration showing the change of Al<111> orientation properties with time when forming an Nb film at a target voltage of −380V or lower, then forming an Al film on the Nb film without heating, and heat-treating the films at 450° C.
Figure 20A:
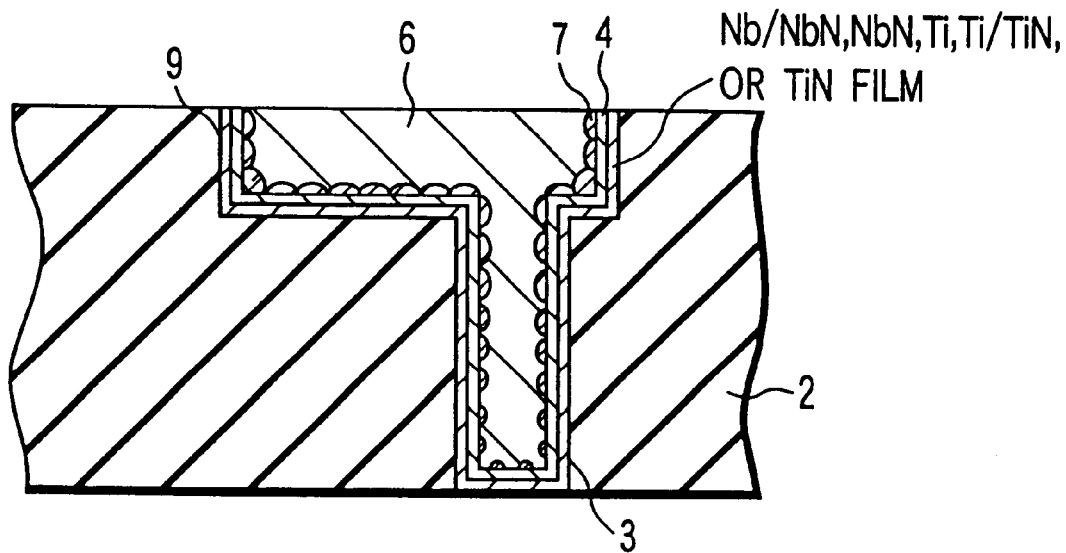
FIGS. 20A and 20B are sectional views for explaining modifications of the present invention.
Figure 20B:
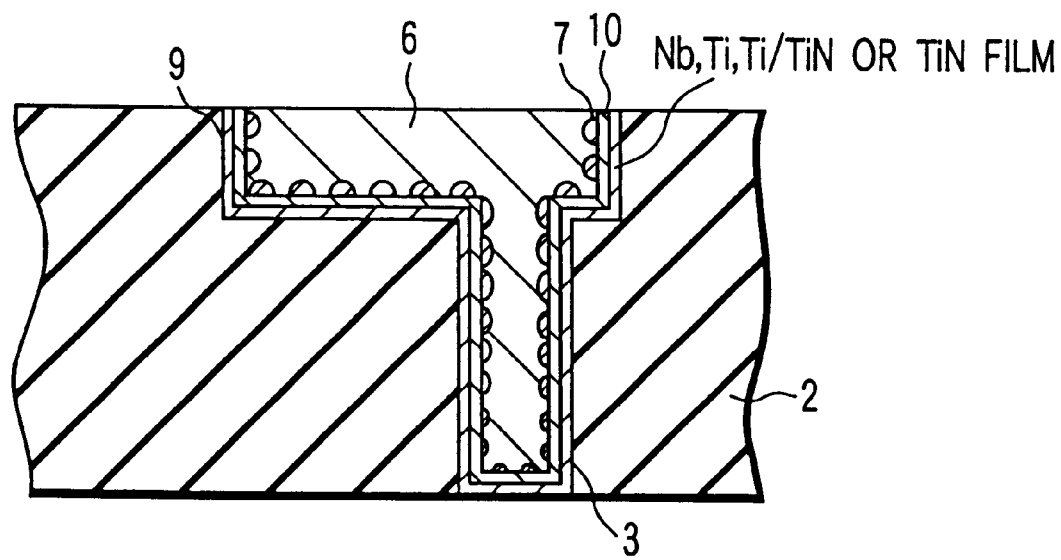

FIG. 21 shows the aging of the Al<111> orientation property when sputter-forming an Nb film at a target voltage of −380V or lower, forming an Al film on the Nb film without heating it, and then performing a heat treatment at 450° C. The heat treatment was performed by heating a substrate.

From FIG. 21, it is found that the orientation property of the Al film is improved as the heat treatment time increases. That is, it is estimated that the Al film formed on the highly-oriented Nb film without heating it has a low orientation property immediately after formed but thereafter, the orientation property is improved because Al takes over Nb lattice information during the heat treatment. Therefore, to highly orient the Al film formed on the highly-oriented Nb film without heating it, it is indispensable to heat-treat the Al film after formed.

A case is described above in which the Al film is formed without heating it. Moreover, the effect of high orientation is also obtained when forming an Al film while heating a substrate. However, to heat the substrate, it is necessary to control the vacuum degree of a system because the surface of an Nb film is easily oxidized compared to the case of no heating.

[Sixth Embodiment]

FIGS. 17A to 17D are process sectional views showing the semiconductor-device manufacturing method of the sixth embodiment of the present invention. A portion corresponding to those in FIGS. 11A to 11F is provided with the same symbol and its detailed description is omitted.

Figure 17A:
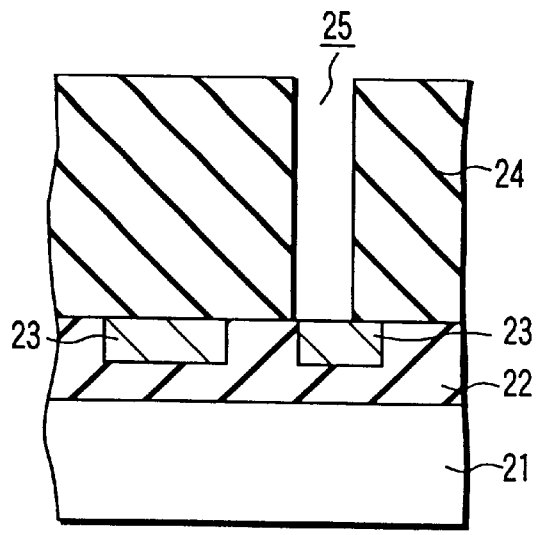
FIGS. 17A to 17D are process sectional views showing the semiconductor-device manufacturing method of the sixth embodiment of the present invention.

First, as shown in FIG. 17A, a first interlayer-insulating film 22, first wiring layer 23, second layer-insulting film 24, and connection hole 25 are formed on an Si substrate 21 with a device (not shown) formed on it similarly to the fifth embodiment.

Figure 17B:
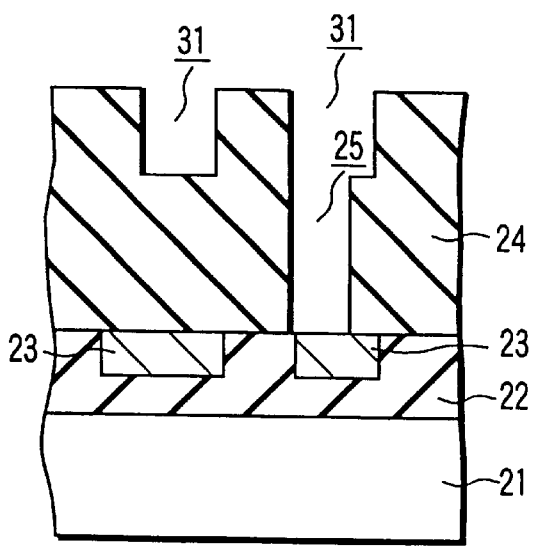

Then, as shown in FIG. 17B, a wiring groove 31 for second wiring is formed on the second interlayer-insulating film 24 through photolithography and RIE.

Figure 17C:
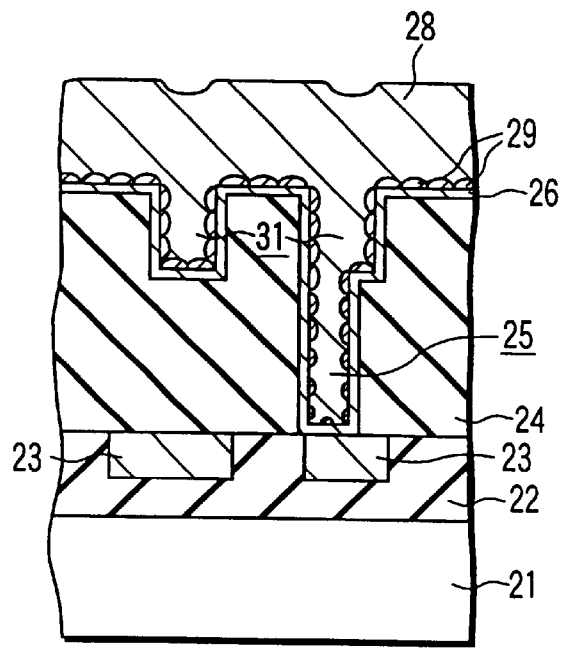

Then, as shown in FIG. 17C, insides of the connection hole 25 and wiring groove 31 are filled with the first and second Al films 28 through the Nb liner film 26 by using the cluster tool described for the fifth embodiment and thereby performing degassing (DEGAS), reverse sputtering, Nb sputtering, first Al sputtering, and second Al sputtering.

Figure 17D:
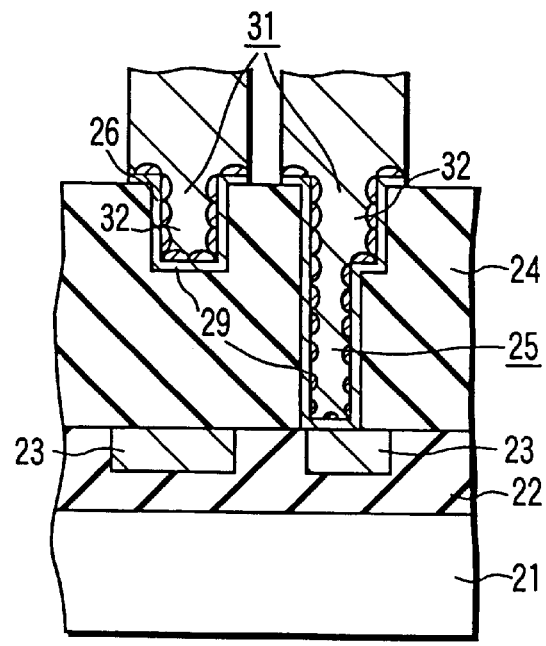

Finally, as shown in FIG. 17D, by removing the first and second Al films 28 from the outsides of the connection hole 25 and wiring groove 31 through CMP, a second Al-wiring layer (Al dual-damascene wiring) made of the first and second Al films 28 is completed.

For the fifth embodiment, it is described that the Nb liner film sputter-formed by a large sputtering power is <110>-oriented and the Al wiring layer on the highly-oriented Nb liner film shows a high <111> orientation.

However, in the case of the damascene-type wiring of this embodiment, the second Al-wiring layer 32 may be <111>-oriented in the axial direction vertical to two sides (side of connection hole and side of wiring groove) and the axial direction vertical to the one bottom (bottom of wiring groove).

Figure 18:
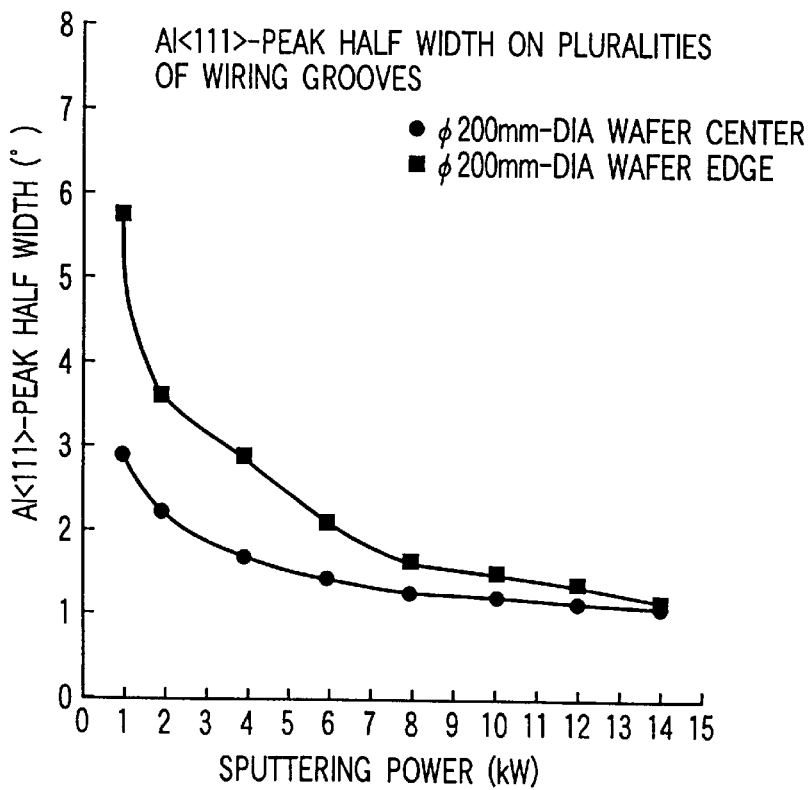
FIG. 18 is an illustration showing the relation between Al<111> orientation and sputtering power on a sample in which a plurality of wiring grooves are arranged.

FIG. 18 shows the relation between Nb sputtering power and Al<111> orientation on a substrate, i.e., the axial direction vertical to the bottom of the wiring groove, on which pluralities of wiring grooves are arranged.

From FIG. 18, it is found that an Al film on a wiring groove shows a high <111> orientation in the axial direction vertical to the substrate as the sputtering power increases. That is, the orientation of the surface of the substrate and the orientation of the bottom of the wiring grooves are more dominant than the orientation from two sides. Moreover, by sputtering an Nb film at a power of 8 kW or more, a high reliability can be obtained for the orientation of an Al film in a wiring groove.

Particularly, by forming an Al film through the directional sputtering method such as the long-throw sputtering method, an Al film formed on the side of a wiring groove become thin and an Al film formed on the surface of a substrate or the bottom of a wiring groove becomes thick.

Therefore, compared to the case of an Al film formed in conformal manner through the CVD method, the orientation from the surface of a substrate and the orientation from the bottom of a wiring groove are dominant and thereby, it is possible to reduce the influence of the orientation from a side.

Moreover, in the case of a damascene wiring, the Nb liner film 26 or AlNb alloy film 29/Nb liner film 26 is present on two sides and one side. Because these films serve as compensation conductors that can be conducted when a second Al wiring layer is disconnected, they contribute to improvement of the EM resistance.

Therefore, by combining the effect of a highly-oriented Al film with that of a compensation conductor, the EM resistance of an Al dual-damascene wiring (hereafter referred to as damascene wiring) is extremely improved by the synergistic effect between the former effects.

Moreover, because the Nb liner film 26 reacts on the first Al film 27 to form the AlNb alloy film 29, the adhesiveness of the damascene wiring 32 is improved. Because the diffusion coefficient of Al decreases at an interface superior in adhesiveness, the SM resistance of an Al·DD wiring 32 is extremely improved.

As described for the fifth embodiment, because the number of unstable grain boundaries having a large diffusion coefficient is decreased in an Al film highly <111>-oriented, the SM resistance is also improved.

Therefore, by combining the effect of a highly-oriented Al film with that of adhesiveness, the EM resistance of the damascene wiring 32 is extremely improved by the synergistic effect between the former effects.

In FIG. 12, the Al orientation properties on wiring grooves are evaluated by averaging them. Moreover, the present inventor et al. examined Al orientation properties on planes vertical to and in parallel with the longitudinal direction of a damascene wiring in detail.

Figure 19:
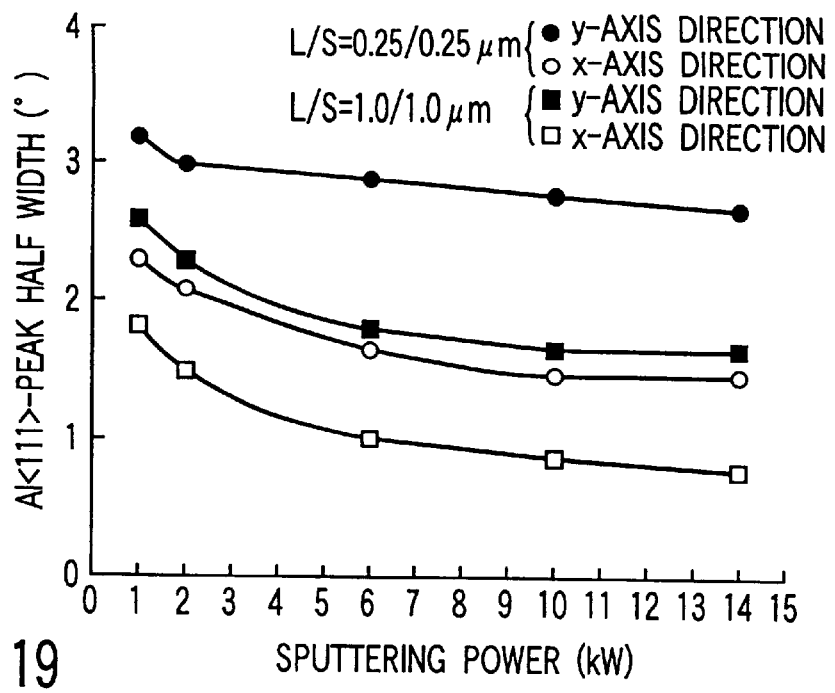
FIG. 19 is an illustration showing rocking curves of the damascene wiring obtained by applying X-rays in the directions in parallel with and vertical to the longitudinal direction of the wiring in accordance with the X-ray diffraction method.

FIG. 19 shows the half width (A) of the rocking curve of the Al<111> peak of the damascene wiring 32 obtained by applying X-rays in the direction parallel with the longitudinal direction (hereafter referred to as wiring longitudinal direction) of the damascene wiring 32 through the X-ray diffraction method and the half width (B) of the rocking curve of the Al<111> peak of the damascene wiring 32 obtained by applying x-rays in the direction vertical to the wiring longitudinal direction of the damascene wiring 32 through the X-ray diffraction method.

By applying X-rays in the direction in parallel with the longitudinal direction of the wiring (x-axis), it is possible to measure the dispersion of the Al<111> orientation in the direction parallel with the longitudinal direction of the wiring. Moreover, by applying X-rays in the direction vertical to the longitudinal direction of the wiring (y-axis), it is possible to measure the dispersion of the Al<111> orientation in the direction vertical to the longitudinal direction of the wiring.

From FIG. 19, it is found that the half width of the rocking curve of the Al<111> peak when applying X-rays in a y-axial direction is larger than that of the rocking curve of the Al<111> peak when applying X-rays in an x-axial direction. This is probably because the Al<111> orientation in the substrate vertical-width direction is retreated with respect to the wiring longitudinal direction due to the Al orientation from the side of a wiring groove and a shift occurs in the vertical direction.

Moreover, it is found that the half width of the rocking curve of the Al<111> peak is larger when L/S (line/space: line corresponds to wiring groove) is 0.25 µm/0.25 µm than when L/S is 1.0 µm/1.0 µm.

This is probably because, in the case of the sample used for an experiment shown in FIG. 19, the orientation from the bottom of a wiring groove is dominant because the area of the bottom of a wiring groove contacting with a damascene wiring is larger than that of the side of the wiring groove contacting with the damascene wiring when L/S is 1.0 µm/1.0 µm. When L/S is 0.25 µm/0.25 µm, however, it is estimated that, because the contact area of the bottom of the wiring groove is larger than that of the side of the wiring groove, the Al<111> orientation when applying X-rays to y-axis is fluctuated by further receiving the influence of the side.

Thus, in the case of a damascene wiring, a shift tends to occur in the Al<111> bearing at a plane vertical to the wiring longitudinal direction due to the side of a wiring groove. Moreover, a shift of the orientation property becomes more remarkable as a wiring width decreases.

From the viewpoint of the wiring reliability, to improve the EM resistance, it is preferable to realize the Al<111> orientation in the substrate vertical-axial direction and reduce the number of unstable grain boundaries having a large diffusion coefficient as many as possible.

In the case of a damascene wiring, however, a shift of the orientation property in a plane vertical to the wiring longitudinal direction is not random dispersion because of receiving the influence of the side of a wiring groove and the orientation property a vertical plane in parallel with the wiring longitudinal direction is secured. Therefore, the number of unstable grain boundaries does not increase or the problem of EM-resistance deterioration does not occur.

Moreover, it is known that, by heat-treating a highly-oriented Al film, a hillock easily occurs that has a shape in which a crystal grain suddenly rises. This is probably because, when there are a small number of crystal grains having a low orientation property enclosed by a large number of crystal grains having a high orientation property, stresses are concentrated on the crystal grains having a low orientation property and a sudden Hill Lock occurs. This type of hillock resultantly causes a short circuit in a wiring.

Concerning the above problem, a damascene wiring in which the Al orientation property is shifted on a plane vertical to the wiring longitudinal direction is able to disperse the stresses of crystal grains and prevent a hillock from suddenly occurring. Such a shift of the Al orientation property with respect to each axial direction is significantly developed by the present invention in which it has been made evident that a resistance against stress migration is improved.

Therefore, by forming a damascene wiring in which the half width of the rocking curve of the Al<111> peak when applying X-rays in y-axial direction is larger than that of the rocking curve of the Al<111> peak when applying X-rays in x-axial direction, it is possible to avoid the problem of wiring short-circuit and improve the reliability because there is not the problem of EM-resistance deterioration as described above.

The present invention is not restricted to the above embodiments. For example, for the first to fourth embodiments, a method is described in which an Nb liner film or NbN liner film is formed through the directional sputtering method, a first Al film is formed through the directional sputtering method without heating it, and then a second Al film is formed through the sputtering method while heating the film. However, it is also possible to form an Nb liner film or NbN liner film and thereafter, form a one-layer Al film through the sputtering method while heating it.

This is because there is an Nb liner film or NbN liner film and thereby, agglomeration of an Al film is controlled by the reaction with the Nb or NbN liner film even if forming the Al film while heating it, and filling can be made through reflow.

Moreover, for the first to fourth embodiments, a method is described in which an Nb film or NbN film is formed through the directional sputtering method, a first Al film is formed through the directional sputtering method without heating it, and then a second Al film is formed through the sputtering method while heating it. However, it is also possible to form the first Al film through the CVD.

This is because there is an Nb or NbN liner film and thereby, an Al film becomes a continuous film even if forming it through the CVD and the CVD is able to form a film in conformal manner. Therefore, it is possible to increase the thickness of an Al film at the bottom of a connection hole.

However, an Al film formed through the CVD using an organic material gas has a problem that an impurity such as carbon is mixed and thereby, the reliability of a wiring layer deteriorates. In this case, by forming a thin first Al film through the CVD method and then, forming a second Al film through the sputtering method, it is possible to form a wiring layer having a desired thickness without causing the reliability to deteriorate.

Moreover, for the first to fourth embodiments, a method is described in which an Nb film or an NbN film is formed through the directional sputtering method. However, it is also possible to form an Nb film or NbN film through the CVD. The reason is described below.

In the case of the sputtering method. A Nb or NbN film at the bottom of a connection hole are made thin. Therefore, to secure an Nb or NbN film necessary for Al agglomeration control at the bottom of a connection hole, a thick Nb or NbN film unnecessary for the inner surface of a wiring groove is formed. The Nb or NbN film are made thin in the substantial Al sectional area of a wiring portion and causes the wiring resistance to increase.

On the other hand, the CVD method makes it possible to form an Nb or NbN film in a connection hole or wiring groove in conformal manner. Therefore, it is possible to form a thick Nb or NbN film at the bottom of a connection hole where the film thickness easily is made thin. Thereby, it is possible to prevent an Nb or NbN film from being excessively formed on the inner surface of a wiring groove and thus, it is possible to further effectively prevent the wiring resistance from increasing.

Moreover, CVD can be easily applied to an Nb film by using Nb fluoride having a high vapor pressure at a room temperature. Furthermore, it is possible to form an NbN film by using a mixed gas of Nb fluoride and ammonia and control the nitrified amount of the NbN film by adjusting the mixing ratio of Nb fluoride and ammonia.

Furthermore, it is possible to form an NbN film by nitrifying it after forming an Nb film. Post-nitrification includes thermal nitrification in which a heat treatment is performed in the atmosphere of $N_2$ or $NH_3$ and plasma nitrification in which $N^+$ ions are applied to an Nb film under plasma.

Particularly, the plasma nitrification makes it possible to lower the temperature of an Si substrate. Moreover, a DD structure makes it possible to preferentially nitrify an Nb film formed on the inner surface of a wiring groove because the collision probability of $N^+$ ions on the inner surface of a connection hole is higher than that of $N^+$ ions on the inner surface of a wiring groove. Moreover, it is possible to decrease the amount of the reaction product between the Nb film and Al film of a wiring portion and reduce the wiring resistance. In this case, the collision probability of $N^+$ ions can be adjusted by a gas pressure.

Furthermore, for the first to fourth embodiments, an Al film is reflowed while heating an Si substrate. However, it is also possible to reflow the Al film by dividing the heating of the Si substrate into a plurality of steps.

For example, the first half of the reflow step is performed at a low temperature and the second half of the reflow step is performed at a high temperature. According to the above two-step heating, because the first half of reflow is performed at a low temperature, the reaction between an Nb or NbN film and an Al film is controlled and the agglomeration of the Al film is controlled.

In this case, because the first half of the reflow step is performed at a low temperature, the flow quantity of the Al film decreases. Therefore, voids are left in the Al film in a connection hole. Particularly, when using a low-permittivity insulating film as a interlayer-insulating film, gas is discharged from the insulating film and voids easily remain. However, because the thickness of the Al film on the inner surface of the connection hole is increased, the Al film is not agglomerated and thus, it is possible to completely fill the remaining voids with the Al film.

Moreover, as described above, when using a low-permittivity insulating film particularly producing much released gas as a interlayer-insulating film, the Al flowability is lowered due to discharge of gas from the insulating film and thereby, voids easily remain. However, by performing the first half of the reflow step at a low temperature, it is possible to decrease the amount of gas to be discharged from the insulating film and thereby, contamination of the surface of Al due to the discharged gas is controlled and the Al surface can keep an active state. Therefore, even if voids remain under the low-temperature reflow step, it is possible to easily fill the voids at the second-half high-temperature reflow step.

Therefore, by performing reflow through the above multiple-step heating, it is possible to fill a connection hole having a higher aspect ratio with an Al film compared to the case of performing reflow through heating at a certain temperature.

Moreover, for the first to fourth embodiments, an Nb or NbN film is directly formed on an Si substrate as a liner film. However, to control the reaction with the Si substrate or decrease the contact resistance, it is preferable to form an Nb/Nb film made of an NbN film, TiN film, Nb film, Ti film, Nb film, and NbN film formed on the Nb film or a Ti/TiN film made of a TiN film and an TiN film formed on the Ti film as a substrate.

In this case, when using an NbN film having a barrier property as a liner film, it is basically unnecessary to form a barrier-metal film as a substrate. However, because an NbN film having a small nitrified amount of film deteriorates in barrier property, it is not always possible to secure the barrier property. For example, when nitrifying an Nb film in order to slightly decrease the reaction rate with an Al film, it is not always possible to secure the barrier property. In this case, it is possible to form a TiN film having a high barrier property on the lower layer of the NbN film.

Moreover, various modifications of the present invention are allowed as long as they do not deviate from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an interlayer-insulating film formed on one principal plane of a semiconductor substrate and having a concave portion;
a liner film made of Nb and formed inside said concave portion, the Nb in said liner film being <110>-oriented in an axial direction orthogonal to one principal plane of said semiconductor substrate;
an Al wiring layer mainly containing Al formed in said concave portion having said liner film; and an NbAl alloy formed at least at an interface between said liner film and said Al wiring layer.

2. The semiconductor device according to claim 1, wherein a half width of a rocking curve of an Nb<110> peak measured by an X-ray diffraction method shows 5.21° or less.

3. The semiconductor device according to claim 1, wherein said Al wiring layer is <111>-oriented in the axial direction vertical to the one principal plane of said semiconductor substrate.

4. The semiconductor device according to claim 1, wherein a half width of a rocking curve of an Nb<110> peak measured by an X-ray diffraction method shows 5.21° or less, and said Al wiring layer is <111>-oriented in the axial direction vertical to the one principal plane of said semiconductor substrate and a half width of a rocking curve of an Al<111> peak measured by the X-ray diffraction method is 1.92° or less.

5. A semiconductor device comprising:

an interlayer-insulating film formed on one principal plane of a semiconductor substrate and having a concave portion;

a liner film of Nb formed inside said concave portion, the Nb in said liner film being <110>-oriented in an axial direction vertical to one principal plane of said semiconductor substrate, and a half width of a rocking curve of an Nb<110> peak measured by an X-ray diffraction method being 5.21° or less;

an Al wiring layer mainly containing Al formed in said concave portion having said liner film; and an NbAl alloy formed at least at an interface between said liner film and said Al wiring layer.

6. A semiconductor device comprising:

an interlayer-insulating film formed on one principal plane of a semiconductor substrate and having a concave portion;

a liner film made of Nb and formed inside of said concave portion, the Nb in said liner film being <110>-oriented in an axial direction vertical to one principal plane of said semiconductor substrate, and a rocking curve of an Nb<110> peak measured by an X-ray diffraction method being 5.21° or less;

an Al wiring layer mainly containing Al formed in said concave portion having said Al wiring layer being <111>-oriented in the axial direction vertical to the one principal plane of said semiconductor substrate, and a half width of a rocking curve of an Al<111> peak measured by the X-ray diffraction method being 1.92° or less; and an NbAl alloy formed at least at an interface between said liner film and said Al wiring layer.

* * * * *

UNITED STATES PATENT AND TRADEMARK OFFICE
CERTIFICATE OF CORRECTION

PATENT NO.    : 6,307,267 B1
DATED         : October 23, 2001
INVENTOR(S)   : Junichi Wada et al.

It is certified that error appears in the above-identified patent and that said Letters Patent is hereby corrected as shown below:

<u>Title page,</u>
Item [54], in the Title, after "DEVICE", delete "AND MANUFACTURING METHOD THEREOF".

<u>Column 26,</u>
Line 18, after "portion having", insert -- said liner film, --.

Signed and Sealed this

Twenty-seventh Day of August, 2002

Attest:

Attesting Officer

JAMES E. ROGAN
*Director of the United States Patent and Trademark Office*